(12) United States Patent
Sato et al.

(10) Patent No.: US 10,708,511 B2
(45) Date of Patent: Jul. 7, 2020

(54) THREE-DIMENSIONAL MOTION OBTAINING APPARATUS AND THREE-DIMENSIONAL MOTION OBTAINING METHOD

(71) Applicant: Panasonic Intellectual Property Management Co., Ltd., Osaka (JP)

(72) Inventors: Satoshi Sato, Kyoto (JP); Sanshiro Shishido, Osaka (JP); Katsuya Nozawa, Osaka (JP); Takeo Azuma, Kyoto (JP); Masaaki Yanagida, Kyoto (JP); Takeyoshi Tokuhara, Osaka (JP); Kunio Nobori, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 33 days.

(21) Appl. No.: 16/124,435

(22) Filed: Sep. 7, 2018

(65) Prior Publication Data

US 2019/0007594 A1 Jan. 3, 2019

Related U.S. Application Data

(63) Continuation of application No. PCT/JP2018/000612, filed on Jan. 12, 2018.

(Continued)

(30) Foreign Application Priority Data

May 25, 2017 (JP) .................................. 2017-103588

(51) Int. Cl.
*H04N 7/18* (2006.01)
*H04N 5/235* (2006.01)
(Continued)

(52) U.S. Cl.
CPC ............. *H04N 5/2353* (2013.01); *G01C 3/08* (2013.01); *G01S 7/481* (2013.01); *G01S 7/4816* (2013.01);
(Continued)

(58) Field of Classification Search
CPC . G01C 3/08; G01S 17/58; G01S 17/89; G01S 7/481; G01S 7/4816; H04N 5/2353;
(Continued)

(56) References Cited

U.S. PATENT DOCUMENTS

2005/0178946 A1 8/2005 Hashimoto et al.
2006/0023109 A1 2/2006 Mabuchi et al.
(Continued)

FOREIGN PATENT DOCUMENTS

| JP | 10-222665 | 8/1998 |
| JP | 2004-045304 | 2/2004 |

(Continued)

OTHER PUBLICATIONS

International Search Report of PCT application No. PCT/JP2018/000612 dated Mar. 27, 2018.
(Continued)

*Primary Examiner* — Gims S Philippe
(74) *Attorney, Agent, or Firm* — Wenderoth, Lind & Ponack, L.L.P.

(57) ABSTRACT

A three-dimensional motion obtaining apparatus includes: a light source; a charge amount obtaining circuit that includes pixels and obtains, for each of the pixels, a first charge amount under a first exposure pattern and a second charge amount under a second exposure pattern having an exposure period that at least partially overlaps an exposure period of the first exposure pattern; and a processor that controls a light emission pattern for the light source, the first exposure pattern, and the second exposure pattern. The processor
(Continued)

estimates a distance to a subject for each of the pixels on the basis of the light emission pattern and on the basis of the first charge amount and the second charge amount of each of the pixels obtained by the charge amount obtaining circuit, and estimates an optical flow for each of the pixels on the basis of the first exposure pattern, the second exposure pattern, and the first charge amount and the second charge amount obtained by the charge amount obtaining circuit.

20 Claims, 11 Drawing Sheets

Related U.S. Application Data

(60) Provisional application No. 62/455,012, filed on Feb. 6, 2017.

(51) Int. Cl.
    G06T 7/521      (2017.01)
    G06T 7/246      (2017.01)
    G01S 7/481      (2006.01)
    G01S 17/58      (2006.01)
    G01S 17/89      (2020.01)
    G01C 3/08       (2006.01)
    H04N 5/353      (2011.01)
    H04N 5/3745     (2011.01)
    H01L 27/146     (2006.01)

(52) U.S. Cl.
    CPC .............. *G01S 17/58* (2013.01); *G01S 17/89* (2013.01); *G06T 7/246* (2017.01); *G06T 7/521* (2017.01); *H01L 27/14665* (2013.01); *H04N 5/353* (2013.01); *H04N 5/3745* (2013.01); *G06T 2207/10144* (2013.01); *H01L 27/14612* (2013.01)

(58) Field of Classification Search
    CPC .................. H04N 5/353; H04N 5/3745; G06T 2207/10144
    USPC ........................................................ 348/135
    See application file for complete search history.

(56) References Cited

U.S. PATENT DOCUMENTS

| 2008/0231831 | A1  | 9/2008  | Masuda et al. |               |
|--------------|-----|---------|---------------|---------------|
| 2014/0028873 | A1* | 1/2014  | Higuchi       | G06K 9/2054   |
|              |     |         |               | 348/229.1     |
| 2014/0204469 | A1* | 7/2014  | Huang         | G02B 7/04     |
|              |     |         |               | 359/683       |
| 2015/0002734 | A1* | 1/2015  | Lee           | H04N 5/2256   |
|              |     |         |               | 348/367       |
| 2017/0142312 | A1* | 5/2017  | Dal Mutto     | H04N 13/243   |
| 2018/0080761 | A1* | 3/2018  | Takao         | G01S 17/08    |
| 2018/0299554 | A1* | 10/2018 | Van Dyck      | G01S 17/10    |

FOREIGN PATENT DOCUMENTS

| JP | 2006-049361 | 2/2006  |
|----|-------------|---------|
| JP | 2008-241257 | 10/2008 |
| JP | 2011-114486 | 6/2011  |

OTHER PUBLICATIONS

Bruce D. Lucas et al., "An Iterative Image Registration Technique with an Application to Stereo Vision", In Proc. 7th IJCAI, Aug. 1981, pp. 674-679.

Shigeru Ando et al., "Optical Flow Detection via Sinusoidally Modulated Imaging and Its Realization with Correlation Image Sensor", Information Processing Society of Japan, vol. 157, 2007, pp. 77-84 (Partial Translation).

\* cited by examiner

THREE-DIMENSIONAL MOTION OBTAINING APPARATUS AND THREE-DIMENSIONAL MOTION OBTAINING METHOD

BACKGROUND

1. Technical Field

The present disclosure relates to a three-dimensional motion obtaining apparatus and a three-dimensional motion obtaining method for obtaining both distance information and motion information about a subject.

2. Description of the Related Art

Motion information and/or distance information about a subject obtained from an image sensor, such as a CCD (charge coupled device) sensor or a CMOS (complementary MOS) sensor, are important for vehicle perimeter monitoring systems, indoor monitoring systems, outdoor monitoring systems, and interface devices.

Specifically, a technique for simultaneously obtaining motion information and distance information is called three-dimensional motion estimation and is very effective in environment recognition for a moving object.

However, with three-dimensional motion estimation in the related art, it is difficult to obtain distance information and motion information about a subject with high accuracy by using one image sensor.

In the related art, an optical flow is widely used to obtain motion information about a subject. A technique is widely used from the viewpoint of computation costs in which an optical flow is calculated by using an optical flow constraint equation given the fact that, in two images, namely, a first image and a second image, that are images of a moving subject captured at different times, even if a pixel corresponding to the same portion included in the subject moves, the brightness (pixel value) of the pixel remains unchanged (for example, B. D. Lucas and T. Kanade, "An Iterative Image Registration Technique with Application to Stereo Vision", In Proc. 7th IJCAI, pp. 674 to 679, 1981, hereinafter referred to as "the Lucas publication"). Shigeru Ando, Dabi Wei, Paul Masurel, "Optical Flow Detection via Complex-sinusoidally Modulated Imaging and Its Realization with Correlation Image Sensor", Information Processing Society of Japan, Special Interest Group Technical Report, Computer Vision and Image Media (CVIM), Vol. 157, pp. 77 to 84, 2007 (hereinafter referred to as "the Ando publication") discloses a technique for calculating an optical flow from one frame by using a time correlation image sensor that calculates a time correlation between an externally supplied reference signal and a temporal change in light intensity during exposure.

Furthermore, a method using TOF (Time-of-Flight) to obtain three-dimensional information about a subject is widely known (for example, Japanese Patent No. 3758618).

However, an optical flow constraint equation is an undetermined problem and is unable to be solved unless some constraint condition is added. For example, in an optical flow detection technique in the Lucas publication, a solution is calculated by using a constraint condition that the optical flow is constant in neighborhoods in addition to an optical flow constraint equation. However, such a constraint condition is generally not satisfied in all scenes, and therefore, the accuracy of the calculated optical flow decreases, which is a problem. Furthermore, an optical flow constraint equation assumes that "the brightness (pixel value) of a pixel remains unchanged even if the pixel moves", and therefore, it is difficult to use an optical flow constraint equation together with a floodlight-type distance information obtaining method, such as the TOF method.

Regarding the Ando publication, further wiring is necessary than a general CMOS sensor, resulting in a decrease in the aperture and a decrease in the sensitivity, which is a problem.

In view of the above-described problems, the present inventor has conceived a three-dimensional motion obtaining apparatus and a three-dimensional motion obtaining method according to aspects of the present disclosure described below.

SUMMARY

One non-limiting and exemplary embodiment herein provides a three-dimensional motion obtaining apparatus capable of obtaining distance information and motion information about a subject with high accuracy by using one image sensor. Another non-limiting and exemplary embodiment provides a three-dimensional motion obtaining method that is used in the three-dimensional motion obtaining apparatus.

In one general aspect, the techniques disclosed here feature a three-dimensional motion obtaining apparatus including: a light source; a charge amount obtaining circuit that includes pixels and obtains, for each of the pixels, a first charge amount under a first exposure pattern and a second charge amount under a second exposure pattern having an exposure period that at least partially overlaps an exposure period of the first exposure pattern; and a processor that controls a light emission pattern for the light source, the first exposure pattern, and the second exposure pattern. The processor estimates a distance to a subject for each of the pixels of the charge amount obtaining circuit on the basis of the light emission pattern and on the basis of the first charge amount and the second charge amount of each of the pixels of the charge amount obtaining circuit obtained by the charge amount obtaining circuit, estimates an optical flow for each of the pixels of the charge amount obtaining circuit on the basis of the first exposure pattern, the second exposure pattern, and the first charge amount and the second charge amount of each of the pixels of the charge amount obtaining circuit obtained by the charge amount obtaining circuit, and outputs the estimated distance and the estimated optical flow.

According to the present disclosure, distance information and motion information (optical flow) about a subject can be obtained with high accuracy by using one image sensor (charge amount obtaining circuit).

It should be noted that general or specific embodiments may be implemented as a system, an integrated circuit, a computer program, a computer-readable recording medium, or any selective combination thereof. Examples of a computer-readable recording medium include a non-volatile recording medium, such as a CD-ROM (compact disc read-only memory).

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
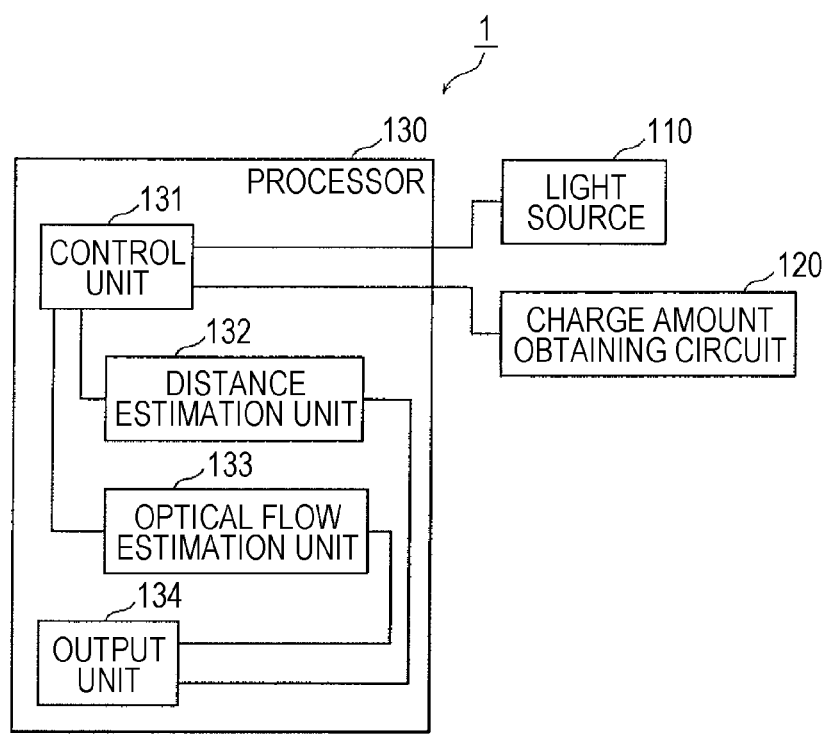
FIG. 1 is a block diagram illustrating a configuration of a three-dimensional motion obtaining apparatus according to a first embodiment.

A three-dimensional motion obtaining apparatus according to an aspect of the present disclosure includes: a light source; a charge amount obtaining circuit that includes pixels and obtains, for each of the pixels, a first charge amount under a first exposure pattern and a second charge amount under a second exposure pattern having an exposure period that at least partially overlaps an exposure period of the first exposure pattern; and a processor that controls a light emission pattern for the light source, the first exposure pattern, and the second exposure pattern. The processor estimates a distance to a subject for each of the pixels of the charge amount obtaining circuit on the basis of the light emission pattern and on the basis of the first charge amount and the second charge amount of each of the pixels of the charge amount obtaining circuit obtained by the charge amount obtaining circuit, estimates an optical flow for each of the pixels of the charge amount obtaining circuit on the basis of the first exposure pattern, the second exposure pattern, and the first charge amount and the second charge amount of each of the pixels of the charge amount obtaining circuit obtained by the charge amount obtaining circuit, and outputs the estimated distance and the estimated optical flow.

With the three-dimensional motion obtaining apparatus thus configured, distance information and motion information (optical flow) about a subject can be obtained with high accuracy by using one image sensor (charge amount obtaining circuit).

Preferably, the processor controls the first exposure pattern and controls the second exposure pattern by controlling an exposure period or an exposure sensitivity for each of the pixels of the charge amount obtaining circuit.

Preferably, the charge amount obtaining circuit further obtains, for each of the pixels, a third charge amount under a third exposure pattern having an exposure period that at least partially overlaps the exposure period of the first exposure pattern and the exposure period of the second exposure pattern; in the first exposure pattern, an exposure sensitivity changes in a form of a sine wave having a predetermined cycle; in the second exposure pattern, an exposure sensitivity changes in a form of a sine wave having the predetermined cycle and having a phase different from a phase of the sine wave in the first exposure pattern; in the third exposure pattern, an exposure sensitivity changes in a form of a rectangular wave; and the processor estimates the distance also on the basis of the third charge amount of each of the pixels of the charge amount obtaining circuit obtained by the charge amount obtaining circuit, and estimates the optical flow also on the basis of the third charge amount of each of the pixels of the charge amount obtaining circuit obtained by the charge amount obtaining circuit.

Preferably, in the light emission pattern, a light emission amount changes in a form of a sine wave having the predetermined cycle.

Preferably, in the first exposure pattern, an exposure sensitivity changes in a form of a rectangular wave in a first period, and the exposure sensitivity changes in a form of a sine wave having a predetermined cycle in a second period that does not include the first period; and in the second exposure pattern, an exposure sensitivity changes in a form of a rectangular wave in a third period, and the exposure sensitivity changes in a form of a sine wave having the predetermined cycle in a fourth period that does not include the third period.

Preferably, in the light emission pattern, a light emission amount changes in a form of a rectangular wave.

Preferably, each of the pixels includes sub-pixels within one aperture; each of the sub-pixels includes a photoelectric converter that includes a first electrode, a second electrode positioned further from the semiconductor substrate than the first electrode, and a photoelectric conversion member positioned between the first electrode and the second electrode, which are stacked upward on a main flat surface of a semiconductor substrate; and the charge amount obtaining circuit further includes an electrode control circuit that controls a potential of the first electrode in each of the sub-pixels.

Preferably, the electrode control circuit is electrically connected to the first electrode in each of the sub-pixels via a capacitor.

Preferably, each of the pixels includes one color filter shared by the sub-pixels included in the pixel.

Preferably, each of the pixels includes one on-chip microlens shared by the sub-pixels included in the pixel.

Preferably, the electrode control circuit changes the potential of the first electrode in each of the sub-pixels in a non-exposure period other than the exposure period to change an exposure sensitivity for each of the sub-pixels.

Preferably, the processor calculates two or more optical flow constraint equations independent of each other on the basis of the first exposure pattern, the second exposure pattern, and the first charge amount and the second charge amount of each of the pixels of the charge amount obtaining circuit obtained by the charge amount obtaining circuit, and uses the calculated optical flow constraint equations to estimate the optical flow.

Preferably, in the light emission pattern, a light emission amount of the light source changes in at least a partial period in the exposure period of the first exposure pattern and in at least a partial period in the exposure period of the second exposure pattern.

Preferably, the three-dimensional motion obtaining apparatus further includes a transmission unit that transmits, to the light source, a light emission control signal for causing the light source to emit light in accordance with the light emission pattern; and the light source receives the light emission control signal transmitted from the transmission unit and emits light in accordance with the light emission pattern on the basis of the received light emission control signal.

A three-dimensional motion obtaining method according to an aspect of the present disclosure is a three-dimensional motion obtaining method to be performed by a three-dimensional motion obtaining apparatus including a light source, a charge amount obtaining circuit that includes pixels, and a processor. The method includes: controlling, by the processor, a light emission pattern for the light source, and a first exposure pattern and a second exposure pattern for each of the pixels of the charge amount obtaining circuit, the second exposure pattern having an exposure period that at least partially overlaps an exposure period of the first exposure pattern; obtaining, by the charge amount obtaining circuit for each of the pixels, a first charge amount under the first exposure pattern and a second charge amount under the second exposure pattern; estimating, by the processor, a distance to a subject for each of the pixels of the charge amount obtaining circuit on the basis of the light emission pattern and on the basis of the first charge amount and the second charge amount of each of the pixels of the charge amount obtaining circuit obtained by the charge amount obtaining circuit; estimating, by the processor, an optical flow for each of the pixels of the charge amount obtaining circuit on the basis of the first exposure pattern, the second exposure pattern, and the first charge amount and the second charge amount of each of the pixels of the charge amount obtaining circuit obtained by the charge amount obtaining circuit; and outputting, by the processor, the estimated distance and the estimated optical flow.

With the three-dimensional motion obtaining method thus configured, distance information and motion information (optical flow) about a subject can be obtained with high accuracy by using one image sensor (charge amount obtaining circuit).

Preferably, the processor controls the first exposure pattern and controls the second exposure pattern by controlling an exposure period or an exposure sensitivity for each of the pixels of the charge amount obtaining circuit.

Preferably, the charge amount obtaining circuit further obtains, for each of the pixels, a third charge amount under a third exposure pattern having an exposure period that at least partially overlaps the exposure period of the first exposure pattern and the exposure period of the second exposure pattern; in the first exposure pattern, an exposure sensitivity changes in a form of a sine wave having a predetermined cycle; in the second exposure pattern, an exposure sensitivity changes in a form of a sine wave having the predetermined cycle and having a phase different from a phase of the sine wave in the first exposure pattern; in the third exposure pattern, an exposure sensitivity changes in a form of a rectangular wave; and the processor estimates the distance also on the basis of the third charge amount of each of the pixels of the charge amount obtaining circuit obtained by the charge amount obtaining circuit, and estimates the optical flow also on the basis of the third charge amount of each of the pixels of the charge amount obtaining circuit obtained by the charge amount obtaining circuit.

Preferably, in the light emission pattern, a light emission amount changes in a form of a sine wave having the predetermined cycle.

Preferably, in the first exposure pattern, an exposure sensitivity changes in a form of a rectangular wave in a first period, and the exposure sensitivity changes in a form of a sine wave having a predetermined cycle in a second period that does not include the first period; and in the second exposure pattern, an exposure sensitivity changes in a form of a rectangular wave in a third period, and the exposure sensitivity changes in a form of a sine wave having the predetermined cycle in a fourth period that does not include the third period.

Preferably, in the light emission pattern, a light emission amount changes in a form of a rectangular wave.

A three-dimensional motion obtaining apparatus according to an aspect of the present disclosure is an apparatus including: a light source that emits light in accordance with a first signal; a lens that, from an observation target that receives the light, receives light; a circuit that includes a first pixel cell, a second pixel cell, and a third pixel cell that receive light output from the lens; and a processor. The first pixel cell includes a first electrode, a second electrode, and a first photoelectric material positioned between the first electrode and the second electrode. The second pixel cell includes a third electrode, a fourth electrode, and a second photoelectric material positioned between the third electrode and the fourth electrode. The third pixel cell includes a fifth electrode, a sixth electrode, and a third photoelectric material positioned between the fifth electrode and the sixth electrode. An area defined by an aperture of the lens is larger than an area obtained by adding up an area of the second electrode, an area of the fourth electrode, and an area of the sixth electrode. The first electrode, the third electrode, and the fifth electrode are at the same potential. The first electrode, the third electrode, and the fifth electrode are included in a continuously formed electrode. The first photoelectric material, the second photoelectric material, and the third photoelectric material are included in a continuously formed photoelectric material. A distance between the first electrode and the lens is shorter than a distance between the second electrode and the lens. A distance between the third electrode and the lens is shorter than a distance between the fourth electrode and the lens. A distance between the fifth electrode and the lens is shorter than a distance between the sixth electrode and the lens. The second electrode is connected to a first gate of a first amplifier. The fourth electrode is connected to a second gate of a second amplifier. The sixth electrode is connected to a third gate of a third amplifier. The second electrode is connected to a first signal generator that generates a second signal. The fourth electrode is connected to a second signal generator that generates a third signal. The sixth electrode is connected to a third signal generator that generates a fourth signal. The first amplifier provides an electric signal proportional to an electric signal applied to the first gate as a first output signal of the first cell. The second amplifier provides an electric signal proportional to an electric signal applied to the second gate as a second output signal of the second cell. The third amplifier provides an electric signal proportional to an electric signal applied to the third gate as a third output signal of the third cell. When it is assumed that the first signal is represented by L(t), the second signal is represented by $s1(t)$, the third signal is represented by $s2(t)$, and the fourth signal is represented by s0(t) and that Δt represents a reciprocal of a frame rate, φ represents a phase difference indicating a time difference from a frame timing, and N represents a frequency of a light emission pattern in one frame, $$L(t) = \cos\left(\frac{2\pi N}{\Delta t}t + \varphi\right) + 1$$

$$s0(t) = 1,$$

$$s1(t) = \cos\left(\frac{2\pi N}{\Delta t}t\right) + 1,$$

$$s2(t) = \sin\left(\frac{2\pi N}{\Delta t}t\right) + 1$$

hold.

Hereinafter, a specific example of a three-dimensional motion obtaining apparatus according to an aspect of the present disclosure will be described with reference to the drawings. All embodiments described herein are specific examples of the present disclosure. Therefore, numerical values, shapes, constituent elements, the arrangements and connections of constituent elements, steps, the order of steps, and so on are illustrative and are not intended to limit the present disclosure. Among the constituent elements described in the following embodiments, a constituent element not described in an independent claim is an optional constituent element. Furthermore, each diagram is a schematic diagram and is not necessarily a precise diagram.

First Embodiment

FIG. 1 is a block diagram illustrating a configuration of a three-dimensional motion obtaining apparatus 1 according to an aspect of the present disclosure.

As illustrated in FIG. 1, the three-dimensional motion obtaining apparatus 1 includes a light source 110, a charge amount obtaining circuit 120, and a processor 130.

The light source 110 is, for example, an LED (light emitting diode) and emits intensity-modulated light to a subject. Intensity-modulated light is light having an intensity that can temporally change.

The light source 110 is not necessarily limited to an LED as long as the light source 110 has a function of emitting intensity-modulated light. The light source 110 may be, for example, a laser or an HID (high-intensity discharge) lamp.

The charge amount obtaining circuit 120 is, for example, an image sensor, includes pixels, and has a function of obtaining, for each of the pixels, a first charge amount under a first exposure pattern and a second charge amount under a second exposure pattern having an exposure period that at least partially overlaps the exposure period of the first exposure pattern.

The charge amount obtaining circuit 120 may further obtain, for each of the pixels, for example, a third charge amount under a third exposure pattern having an exposure period that at least partially overlaps the exposure period of the first exposure pattern and the exposure period of the second exposure pattern.

The details of the charge amount obtaining circuit 120 will be described below.

The processor 130 executes a program stored in a memory not illustrated to thereby function as a control unit 131, a distance estimation unit 132, an optical flow estimation unit 133, and an output unit 134.

The control unit 131 controls the light emission pattern for the light source 110. The control unit 131 controls the first exposure pattern and the second exposure pattern in the charge amount obtaining circuit 120.

The control unit 131 may control the first exposure pattern and the second exposure pattern by, for example, controlling the exposure period or the exposure sensitivity for the pixels of the charge amount obtaining circuit 120.

In the first exposure pattern, for example, the exposure sensitivity may change in proportion to the peak value of a sine wave having a predetermined cycle. In the second exposure pattern, for example, the exposure sensitivity may change in proportion to the peak value of a sine wave having the predetermined cycle and having a phase different from the phase of the above-described sine wave having the predetermined cycle. In the third exposure pattern, the exposure sensitivity may change in proportion to the peak value of a rectangular wave.

In the light emission pattern, for example, the light emission amount may change in proportion to the peak value of a sine wave having the predetermined cycle.

In the first exposure pattern, for example, the exposure sensitivity may change in proportion to the peak value of a rectangular wave in a first period, and the exposure sensitivity may change in proportion to the peak value of a sine wave having a predetermined cycle in a second period that does not include the first period. In the second exposure pattern, for example, the exposure sensitivity may change in proportion to the peak value of a rectangular wave in a third period, and the exposure sensitivity may change in proportion to the peak value of a sine wave having the predetermined cycle in a fourth period that does not include the third period.

In the light emission pattern, for example, the light emission amount may change in proportion to the peak value of a rectangular wave.

The details of the operations of the control unit 131 will be described below.

The distance estimation unit 132 estimates the distance to a subject for each of the pixels of the charge amount obtaining circuit 120 on the basis of the light emission pattern for the light source 110 and on the basis of the first charge amount and the second charge amount of each of the pixels of the charge amount obtaining circuit 120 obtained by the charge amount obtaining circuit 120.

The distance estimation unit 132 may estimate the distance on the basis of, for example, the third charge amount of each of the pixels of the charge amount obtaining circuit 120 obtained by the charge amount obtaining circuit 120.

The details of distance estimation will be described below.

The optical flow estimation unit 133 estimates the optical flow for each of the pixels of the charge amount obtaining circuit 120 on the basis of the first exposure pattern, the second exposure pattern, and the first charge amount and the second charge amount of each of the pixels of the charge amount obtaining circuit 120 obtained by the charge amount obtaining circuit 120.

The optical flow estimation unit 133 may estimate the optical flow on the basis of, for example, the third charge amount of each of the pixels of the charge amount obtaining circuit 120 obtained by the charge amount obtaining circuit 120.

The details of optical flow estimation will be described below.

In an optical flow estimation method according to the related art, images of plural frames are used under the assumption that the direction and magnitude of a relative motion between the camera and a subject are constant at a point of interest in the plural frames. The optical flow estimation unit 133 can estimate the optical flow from an image of one frame as described below.

In an optical flow estimation method according to the related art, the brightness of a subject temporally fluctuates under a light source emitting intensity-modulated light, and therefore, it is difficult to estimate the optical flow. The optical flow estimation unit 133 can estimate the optical flow even under a light source emitting intensity-modulated light.

The output unit 134 outputs the distance estimated by the distance estimation unit 132 and the optical flow estimated by the optical flow estimation unit 133.

For example, in an environment recognition system for a self-driving car, in the related art, it is often the case that distance information about a subject is obtained by using LIDAR (light detection and ranging or laser imaging detection and ranging) and motion information is obtained on the basis of an optical flow using a different sensor, such as a camera. In this case, the observation point for the distance information does not match the observation point for the motion information, and a process for integrating the pieces of information obtained by the different sensors needs to be separately performed, and this process is a cause of a decrease in accuracy.

In the three-dimensional motion obtaining apparatus 1 according to the first embodiment, distance information and motion information are obtained by using the same sensor, namely, the charge amount obtaining circuit 120. Therefore, the observation point for the distance information always matches the observation point for the motion information. Accordingly, three-dimensional motion information of higher accuracy can be output while an information processing load is reduced.

In the related art, in a case of using stereo images of plural frames, distance information and motion information based on the same observation point can also be obtained. However, the distance information is estimated from the images for the same timing, and the motion information is estimated from information for different timing. Therefore, the distance information is temporally different from the motion information, and an error occurs when the distance information and the motion information are integrated together. The three-dimensional motion obtaining apparatus 1 according to the first embodiment obtains distance information and motion information from the first charge amount and the second charge amount that are temporally the same, and therefore, a shift between the frames as described above does not occur, and three-dimensional motion information of higher accuracy can be output.

Now, the details of the charge amount obtaining circuit 120 are described.

Figure 2:
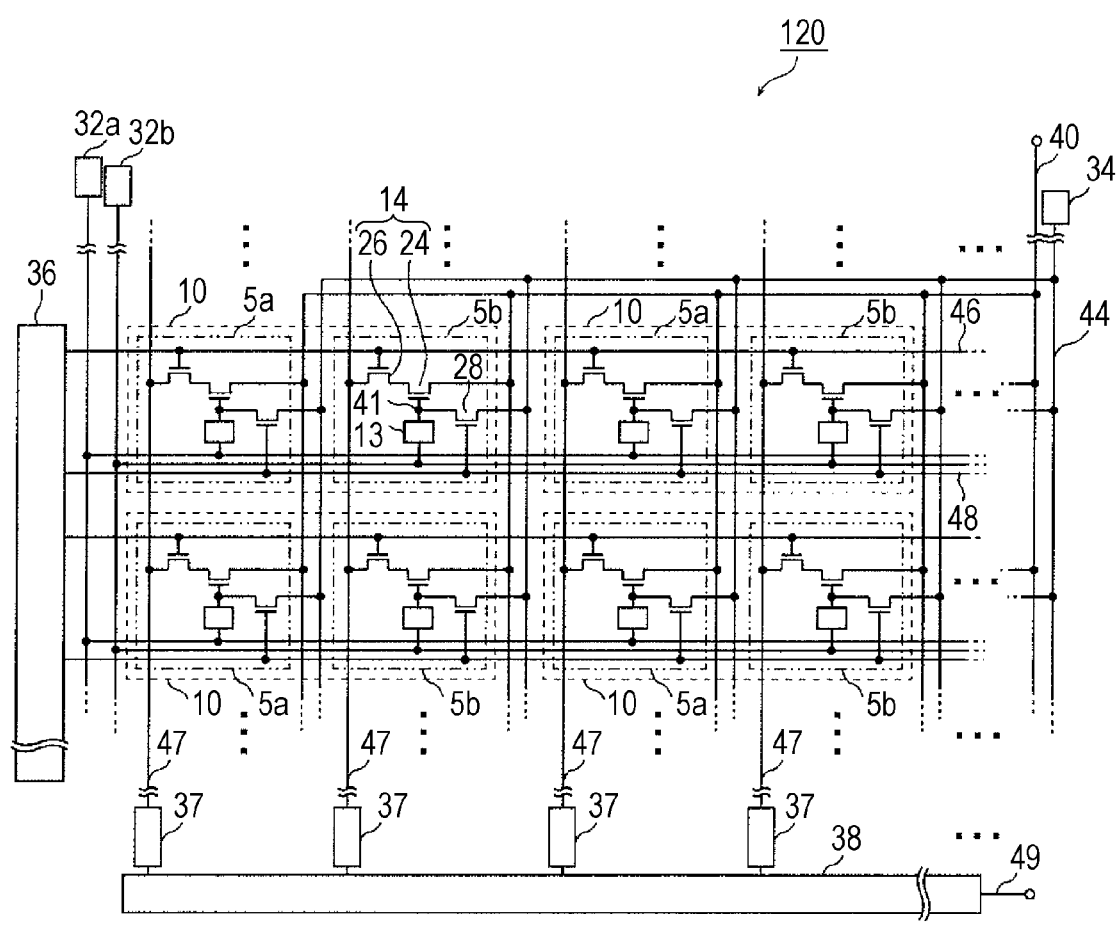
FIG. 2 is a circuit diagram of a charge amount obtaining circuit.

FIG. 2 is a circuit diagram of the charge amount obtaining circuit 120.

As illustrated in FIG. 2, the charge amount obtaining circuit includes pixel cells 10 (pixels) arranged in a two-dimensional array. Each of the pixel cells 10 includes sub-pixel cells 5. Here, a description is given under the assumption that each of the pixel cells 10 includes two sub-pixel cells 5, namely, a sub-pixel cell 5a and a sub-pixel cell 5b. Here, the sub-pixel cell 5a and the sub-pixel cell 5b have a relation such that the sub-pixel cell 5a and the sub-pixel cell 5b are alternately arranged so as to be adjacent to each other in the row direction of the two-dimensional array (hereinafter also referred to as "pixel array PA") of the pixel cells 10. Here, a description is given under the assumption that the sub-pixel cell 5a and the sub-pixel cell 5b have a relation such that the sub-pixel cell 5a and the sub-pixel cell 5b are alternately arranged so as to be adjacent to each other in the row direction of the pixel array PA; however, the sub-pixel cell 5a and the sub-pixel cell 5b may have a relation such that, for example, the sub-pixel cell 5a and the sub-pixel cell 5b are alternately arranged so as to be adjacent to each other in the column direction of the pixel array PA.

Figure 3:
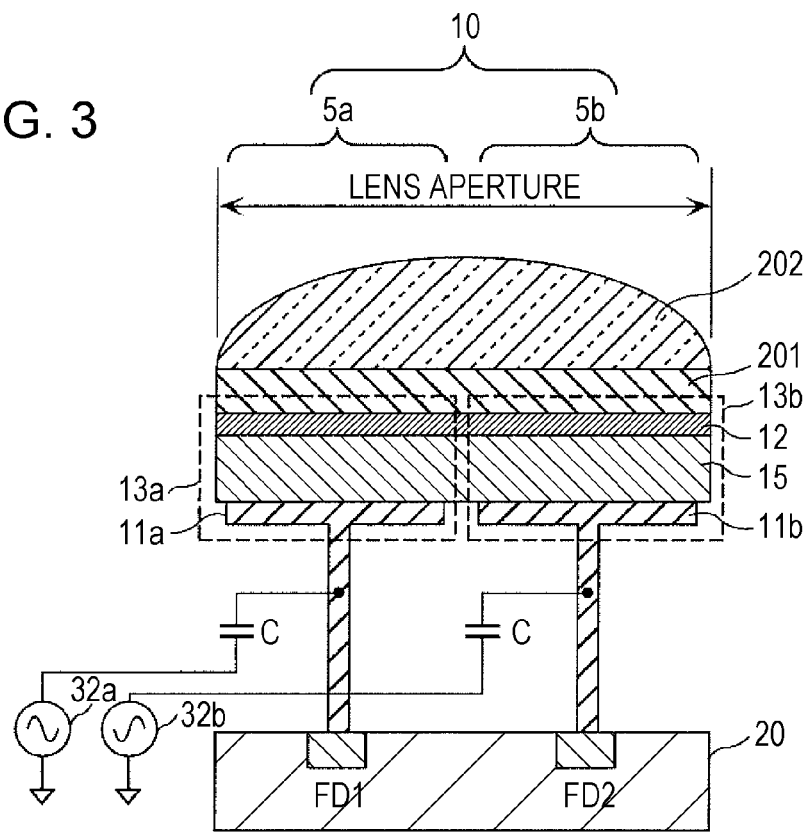
FIG. 3 is a cross-sectional view of an example pixel cell.
Figure 4:
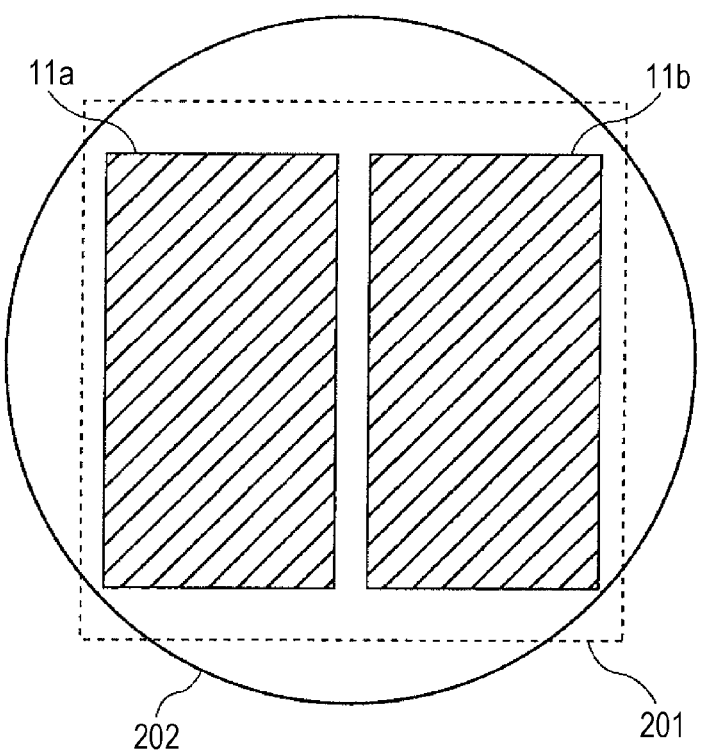
FIG. 4 is a plan view of an example pixel cell.

FIG. 3 is a cross-sectional view of an example of the pixel cell 10. FIG. 4 is a plan view of the example of the pixel cell 10 illustrated in FIG. 3.

As illustrated in FIG. 3 and FIG. 4, the pixel cell 10 includes the plural sub-pixel cells 5 (here, the sub-pixel cell 5a and the sub-pixel cell 5b) within one aperture (lens aperture). The pixel cell 10 includes one color filter 201 shared by the plural sub-pixel cells 5 (here, the sub-pixel cell 5a and the sub-pixel cell 5b) and one on-chip micro-lens 202 shared by the plural sub-pixel cells 5 (here, the sub-pixel cell 5a and the sub-pixel cell 5b).

As illustrated in FIG. 3, the first sub-pixel cell 5a, which is one of the sub-pixel cells 5 of each pixel 10, includes a photoelectric converter 13a, which is a photoelectric converter 13. The photoelectric converter 13a includes a first electrode 11a, which is a first electrode 11 (also referred to as a pixel electrode), a second electrode 12 (also referred to as an opposite electrode) positioned further from the semiconductor substrate 20 than the first electrode 11a, and a photoelectric conversion member 15 positioned between the first electrode 11a and the second electrode 12, which are stacked upward on the main flat surface of a semiconductor substrate 20.

As illustrated in FIG. 3, the second sub-pixel cell 5b, which is one of the sub-pixel cells 5, includes a photoelectric converter 13b, which is a photoelectric converter 13. The photoelectric converter 13b includes a first electrode 11b, which is a first electrode 11 (also referred to as a pixel electrode), a second electrode 12 (also referred to as an opposite electrode) positioned further from the semiconductor substrate 20 than the first electrode 11b, and a photoelectric conversion member 15 positioned between the first electrode 11b and the second electrode 12, which are stacked upward on the main flat surface of the semiconductor substrate 20.

The photoelectric converter 13 generates an electric signal on the basis of light incident on the photoelectric conversion member 15. The electric signal is dependent on the intensity of the light.

The photoelectric converter 13 need not be formed of independent (separate) elements for each of the sub-pixel cells 5. For example, the second electrode 12 of the photoelectric converter 13 included in one of the sub-pixel cells 5 illustrated in FIG. 3 and the second electrode 12 of the photoelectric converter 13 included in the other sub-pixel cell 5 may be formed of a common (unitary) element. For example, the photoelectric conversion member 15 of the photoelectric converter 13 included in one of the sub-pixel cells 5 illustrated in FIG. 3 and the photoelectric conversion member 15 included in the other sub-pixel cell 5 may be formed of a common element (have a one-piece construction).

In FIG. 2, each signal detection circuit 14 is a circuit that detects an electric signal generated by the corresponding photoelectric converter 13. As illustrated in FIG. 2, each signal detection circuit 14 includes a signal detection transistor 24 and an address transistor 26. The signal detection transistor 24 and the address transistor 26 are typically field effect transistors (FETs). In the example described here, the signal detection transistor 24 is an N-channel MOSFET, and the address transistor 26 is an N-channel MOSFET.

As schematically illustrated in FIG. 2, the control terminal (here, the gate) of the signal detection transistor 24 is electrically connected to the photoelectric converter 13. A charge (positive holes or electrons) of an electric signal generated by the photoelectric converter 13 is accumulated at a charge accumulation node 41 between the gate of the signal detection transistor 24 and the photoelectric converter 13. The charge accumulation node 41 is also referred to as a floating diffusion (FD) node.

A first electrode control circuit 32a of the charge amount obtaining circuit 120 is a modulated voltage source that controls the potential of the first electrode 11a of the first one of the two sub-pixel cells 5 (here, the sub-pixel cell 5a) included in each pixel cell 10. A second electrode control circuit 32b is a modulated voltage source that controls the potential of the first electrode 11b of the second one of the two sub-pixel cells 5 (here, the sub-pixel cell 5b) included in each pixel cell 10. The electrode control circuit 32a is not limited to a specific power supply circuit, and the electrode control circuit 32b is not limited to a specific power supply circuit.

As illustrated in FIG. 3, the electrode control circuit 32a and the electrode control circuit 32b are respectively connected to the first electrode 11a and the first electrode 11b via capacitors C. Therefore, even if the electrode control circuit 32a controls the potential of the first electrode 11a, the amount of charge accumulated at the corresponding charge accumulation node 41 is not affected. Furthermore, even if the electrode control circuit 32b controls the potential of the first electrode 11b, the amount of charge accumulated at the corresponding charge accumulation node 41 is not affected.

The details of control of the potential of the first electrode 11a and control of the potential of the first electrode 11b respectively performed by the electrode control circuit 32a and the electrode control circuit 32b will be described below. For example, the electrode control circuit 32a and the electrode control circuit 32b can be used to switch the potential of the first electrode 11a and the potential of the first electrode 11b. That is, the sensitivity can be adjusted on a per sub-cell basis. When the sensitivity of a specific sub-cell is set to the lowest, an electronic shutter operation can be implemented.

Each sub-pixel cell 5 is connected to a power supply line 40 for supplying a supply voltage VDD. As illustrated in FIG. 2, to the power supply line 40, the input terminal (typically, the drain) of each signal detection transistor 24 is connected. When the power supply line 40 functions as a source follower power supply, each signal detection transistor 24 amplifies and outputs a signal generated by the corresponding photoelectric converter 13.

To the output terminal (here, the source) of each signal detection transistor 24, the input terminal (here, the drain) of the corresponding address transistor 26 is connected. The output terminal (here, the source) of each address transistor 26 is connected to a corresponding one of the vertical signal lines 47 arranged in the respective columns of the pixel array PA. The control terminal (here, the gate) of each address transistor 26 is connected to a corresponding one of the address control lines 46. When the potential of each address control line 46 is controlled, output from the corresponding signal detection transistors 24 can be selectively read and output to the vertical signal lines 47.

In the example illustrated in FIG. 2, the address control lines 46 are connected to a vertical scanning circuit (also referred to as "row scanning circuit") 36. The vertical scanning circuit 36 applies a predetermined voltage to each address control line 46 to select the sub-pixel cells 5 arranged in the corresponding row on a per row basis. Accordingly, signals from the selected sub-pixel cells 5 are read.

The vertical signal lines 47 are main signal lines for transmitting pixel signals from the pixel array PA to a peripheral circuit. To each of the vertical signal lines 47, a column signal processing circuit (also referred to as "column signal accumulation circuit") 37 is connected. The column signal processing circuit 37 performs, for example, noise suppress signal processing, typically, correlated double sampling, and analog-digital conversion (AD conversion). As illustrated in FIG. 2, the column signal processing circuit 37 is provided so as to correspond to each column of the sub-pixel cells 5 in the pixel array PA. To the column signal processing circuits 37, a horizontal signal reading circuit (also referred to as "column scanning circuit") 38 is connected. The horizontal signal reading circuit 38 sequentially reads signals from the column signal processing circuits 37 and outputs the signals to a horizontal common signal line 49.

In the configuration illustrated in FIG. 2, each of the sub-pixel cells 5 includes a reset transistor 28. The reset transistor 28 can be, for example, a field effect transistor similarly to the signal detection transistor 24 and the address transistor 26. A description is given below of an example where an N-channel MOSFET is used as the reset transistor 28 unless otherwise specified. As illustrated in FIG. 2, each reset transistor 28 is connected between a reset voltage line 44 for supplying a reset voltage Vr and the corresponding charge accumulation node 41. The control terminal (here, the gate) of each reset transistor 28 is connected to a corresponding one of the reset control lines 48. When the potential of the reset control line 48 is controlled, the potential of the charge accumulation node 41 can be set to the reset voltage Vr to discharge the charge accumulation node 41 at which a charge is accumulated, that is, to reset the corresponding sub-pixel cell 5. In this example, the reset control lines 48 are connected to the vertical scanning circuit 36. Therefore, when the vertical scanning circuit 36 applies a predetermined voltage to each reset control line 48, the sub-pixel cells 5 arranged in the corresponding row can be reset on a per row basis.

In this example, the reset voltage line 44 for supplying the reset voltage Vr to the reset transistors 28 is connected to a reset voltage source 34 (reset voltage supply circuit). The reset voltage source 34 needs to be configured so as to enable supply of the predetermined reset voltage Vr to the reset voltage line 44 when the charge amount obtaining circuit 120 operates, and is not limited to a specific power supply circuit. The electrode control circuit 32a, the electrode control circuit 32b, and the reset voltage source 34 may constitute part of a single voltage supply circuit or may be independent and separate voltage supply circuits. Some or all of the electrode control circuit 32a, the electrode control circuit 32b, and the reset voltage source 34 may constitute part of the vertical scanning circuit 36. A second electrode voltage (opposite electrode voltage) from the electrode control circuit 32a and the electrode control circuit 32b and/or the reset voltage Vr from the reset voltage source 34 may be supplied to each sub-pixel cell 5 via the vertical scanning circuit 36.

As the reset voltage Vr, the supply voltage VDD for each signal detection circuit 14 can be used. In this case, a voltage supply circuit (not illustrated in FIG. 2) that supplies the supply voltage to each sub-pixel cell 5 and the reset voltage source 34 can be integrated together. Furthermore, the power supply line 40 and the reset voltage line 44 can be integrated together, and therefore, the wiring in the pixel array PA can be simplified. However, when different voltages are used as the reset voltage Vr and the supply voltage VDD for each signal detection circuit 14, more flexible control is enabled in the charge amount obtaining circuit 120.

Figure 5:
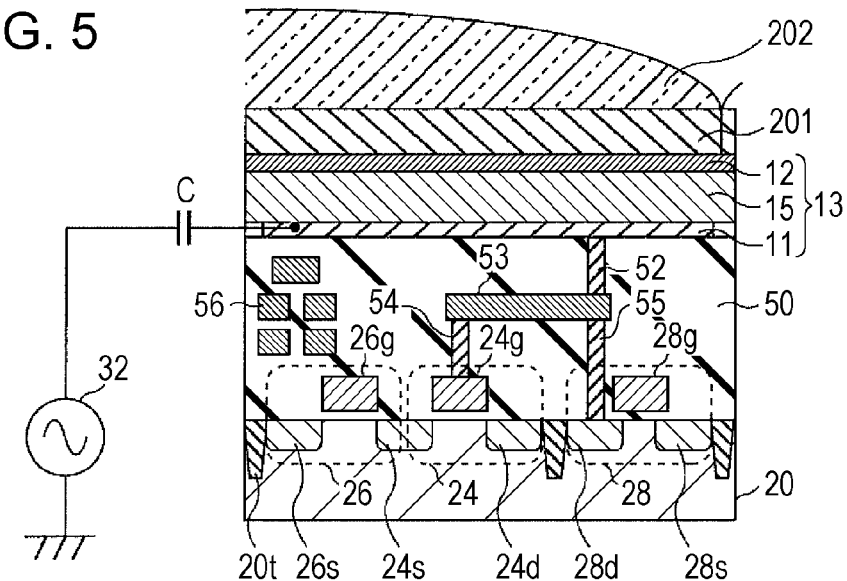
FIG. 5 is a schematic diagram illustrating a device structure of a sub-pixel cell.

FIG. 5 schematically illustrates a device structure of the sub-pixel cell 5. In the configuration illustrated in FIG. 5, the signal detection transistor 24, the address transistor 26, and the reset transistor 28 described above are formed in the semiconductor substrate 20. The semiconductor substrate 20 is not limited to a substrate that is entirely formed of a semiconductor. The semiconductor substrate 20 may be an insulated substrate having a surface, on a side on which a photosensitive region is formed, on which a semiconductor layer is provided. Here, a description is given of an example where a P-type silicon (Si) substrate is used as the semiconductor substrate 20.

The semiconductor substrate 20 has impurity regions (here, N-type regions) 26s, 24s, 24d, 28d, and 28s, an element separation region 20t for electrically separating the sub-pixel cell 5a and the sub-pixel cell 5b from each other, and another element separation region 20t for electrically separating the pixel cell 10 from the other pixel cell 10. Here, another element separation region 20t is also provided between the impurity region 24d and the impurity region 28d. The element separation regions 20t are formed by, for example, ion implantation of an acceptor under a predetermined implantation condition.

The impurity regions 26s, 24s, 24d, 28d, and 28s typically correspond to a diffusion layer formed in the semiconductor substrate 20. As schematically illustrated in FIG. 5, the signal detection transistor 24 includes the impurity regions 24s and 24d and a gate electrode 24g (typically, a polysilicon electrode). The impurity regions 24s and 24d respectively function as, for example, the source region and the drain region of the signal detection transistor 24. Between the impurity regions 24s and 24d, a channel region of the signal detection transistor 24 is formed.

Similarly, the address transistor 26 includes the impurity regions 26s and 24s and a gate electrode 26g (typically, a polysilicon electrode) connected to the corresponding address control line 46 (see FIG. 2). In this example, the signal detection transistor 24 and the address transistor 26 are electrically connected to each other by sharing the impurity region 24s. The impurity region 26s functions as, for example, the source region of the address transistor 26. The impurity region 26s has a connection to the corresponding vertical signal line 47 (see FIG. 2), which is not illustrated in FIG. 5.

The reset transistor 28 includes the impurity regions 28d and 28s and a gate electrode 28g (typically, a polysilicon electrode) connected to the corresponding reset control line 48 (see FIG. 2). The impurity region 28s functions as, for example, the source region of the reset transistor 28. The impurity region 28s has a connection to the reset voltage line 44 (see FIG. 2), which is not illustrated in FIG. 5.

On the semiconductor substrate 20, an interlayer insulating layer 50 (typically, a silicon dioxide layer) is disposed so as to cover the signal detection transistor 24, the address transistor 26, and the reset transistor 28. As illustrated in FIG. 5, in the interlayer insulating layer 50, wiring layers 56 can be disposed. The wiring layers 56 are typically formed of a metal, such as copper, and, for example, some of the wiring layers 56 can include the wiring lines described above, such as the vertical signal lines 47. The number of insulating layers in the interlayer insulating layer 50 and the number of layers of the wiring layers 56 disposed in the interlayer insulating layer 50 can be set to any numbers and are not limited to the example illustrated in FIG. 5.

On the interlayer insulating layer 50, the photoelectric converter 13 described above is disposed. In other words, in the embodiments of the present disclosure, the sub-pixel cells 5 that constitute the pixel array PA (see FIG. 2) are formed on the semiconductor substrate 20. The sub-pixel cells 5 arranged on the semiconductor substrate 20 in two dimensions form the photosensitive region (pixel region). The distance (pixel pitch) between two adjacent sub-pixel cells 5 can be, for example, about 2 μm.

The photoelectric converter 13 includes the first electrode 11, the second electrode 12, and the photoelectric conversion member 15 disposed between these electrodes. In the example (in FIG. 3), the second electrode 12 and the photoelectric conversion member 15 are formed so as to extend over the plural sub-pixel cells 5. On the other hand, the first electrode 11 is provided for each sub-pixel cell 5. The first electrode 11 is spatially separated from the first electrode 11 of the other adjacent sub-pixel cell 5, and therefore, is electrically separated from the first electrode 11 of the other pixel cell 10.

The second electrode 12 is typically a transparent electrode formed of a transparent conductive material. The second electrode 12 is disposed on a side of the photoelectric conversion member 15 on which light is incident. Therefore, light that passes through the second electrode 12 is incident on the photoelectric conversion member 15. Light detected by the charge amount obtaining circuit 120 is not limited to light within the wavelength range of visible light (for example, 380 nm or more and 780 nm or less). The term "transparent" used herein means that at least part of light within a wavelength range to be detected passes through, and light does not necessarily pass through for the entire wavelength range of visible light. General electromagnetic waves including infrared rays and ultraviolet rays are expressed as "light" herein for convenience sake. As the second electrode 12, a transparent conducting oxide (TCO), such as ITO, IZO, AZO, FTO, $SnO_2$, $TiO_2$, or $ZnO_2$, can be used.

When receiving incident light, the photoelectric conversion member 15 generates positive hole-electron pairs. The photoelectric conversion member 15 is typically formed of an organic material.

As described with reference to FIG. 3, the second electrode 12 is formed so as to extend over the plural sub-pixel cells 5. Therefore, it is possible to simultaneously apply the second electrode voltage (opposite electrode voltage) having a desired magnitude to the plural sub-pixel cells 5. As long as the second electrode voltage (opposite electrode voltage) having a desired magnitude can be simultaneously applied to the plural sub-pixel cells 5, the second electrode 12 may be separately provided for each of the sub-pixel cells 5. Similarly, the photoelectric conversion member 15 may be separately provided for each of the sub-pixel cells 5.

The electrode control circuit 32 supplies different voltages to the photoelectric converter 13 in an exposure period and a non-exposure period to thereby control the exposure sensitivity. The term "exposure period" herein means a period during which either a positive charge or a negative charge (signal charge) generated as a result of photoelectric conversion is accumulated in a charge accumulation region and may be referred to as "charge accumulation period". A period during which an image capturing apparatus is operating and that is other than the exposure period is herein referred to as "non-exposure period". The "non-exposure period" is not limited to a period during which light to be incident on the photoelectric converter 13 is blocked and may include a period during which the photoelectric converter 13 is irradiated with light.

When the potential of the second electrode 12 relative to the potential of the first electrode 11 is controlled, either positive holes or electrons among the positive hole-electron pairs generated in the photoelectric conversion member 15 as a result of photoelectric conversion can be collected by the first electrode 11. However, the second electrode 12 is provided so as to extend over the entire surface of the pixel array, and control thereof on a per row basis or on a per pixel basis is difficult. When the line/space is set and signal wiring to each electrode is laid, the second electrode 12 is divided into sub-pixel units by patterning to thereby enable control of the second electrode 12 on a per row basis or on a per pixel basis.

In a case of using, for example, positive holes as a signal charge, when the potential of the second electrode 12 is set to a potential higher than the potential of the first electrode 11, positive holes can be selectively collected by the first electrode 11. The case where positive holes are used as a signal charge is described below. As a matter of course, electrons can be used as a signal charge.

When an appropriate bias voltage is applied between the second electrode 12 and the first electrode 11, the first electrode 11 collects either a positive charge or a negative charge generated in the photoelectric conversion member 15 as a result of photoelectric conversion. The first electrode 11 is formed of, for example, a metal, such as aluminum or copper, a metal nitride, or polysilicon that is doped with impurities and made conductive.

The first electrode 11 may be a light-shielding electrode. For example, when a TaN electrode having a thickness of 100 nm is formed as the first electrode 11, sufficient light shielding can be attained. When the first electrode 11 is formed of a light-shielding electrode, light that passes through the photoelectric conversion member 15 and is to be incident on the channel region or the impurity region of a transistor (in this example, at least one of the signal detection transistor 24, the address transistor 26, and the reset transistor 28) formed in the semiconductor substrate 20 can be suppressed. The wiring layers 56 described above may be used to form a light-shielding film in the interlayer insulating layer 50. When light to be incident on the channel region of the transistors formed in the semiconductor substrate 20 is suppressed, for example, a shift in the properties of the transistors (for example, fluctuations in the threshold voltage) can be suppressed. When light to be incident on the impurity region formed in the semiconductor substrate 20 is suppressed, noise contamination caused by unintended photoelectric conversion in the impurity region can be suppressed. Accordingly, suppression of light to be incident on the semiconductor substrate 20 contributes to an increase in the reliability of the charge amount obtaining circuit 120.

As schematically illustrated in FIG. 5, the first electrode 11 is connected to the gate electrode 24g of the signal detection transistor 24 via a contact plug 52, a wiring line 53, and a contact plug 54. In other words, the gate of the signal detection transistor 24 has an electrical connection to the first electrode 11. The contact plug 52 and the wiring line 53 can be formed of, for example, a metal, such as copper. The contact plug 52, the wiring line 53, and the contact plug 54 constitute at least part of the charge accumulation node 41 (see FIG. 2) between the signal detection transistor 24 and the photoelectric converter 13. The wiring line 53 can be part of any wiring layer 56. The first electrode 11 is connected also to the impurity region 28d via the contact plug 52, the wiring line 53, and a contact plug 55. In the configuration illustrated in FIG. 5, the gate electrode 24g of the signal detection transistor 24, the contact plug 52, the wiring line 53, the contact plugs 54 and 55, and the impurity region 28d, which is either the source region or the drain region of the reset transistor 28, function as the charge accumulation region in which a signal charge collected by the first electrode 11 is accumulated.

When a signal charge is collected by the first electrode 11, a voltage corresponding to the amount of signal charge accumulated in the charge accumulation region is applied to the gate of the signal detection transistor 24. The signal detection transistor 24 amplifies the voltage applied to the gate. The voltage amplified by the signal detection transistor 24 is selectively read via the address transistor 26 as a signal voltage.

In the present disclosure, the electrode control circuit 32 controls (changes) the potential of the first electrode 11 relative to the potential of the second electrode 12 during the non-exposure period to thereby change the exposure sensitivity (implement a variable sensitivity function). When the electrode control circuit 32 selects a potential at which the sensitivity becomes the lowest and simultaneously controls all pixels to apply the potential at which the sensitivity becomes the lowest to every pixel, a global shutter function in which the sensitivity of all pixels is simultaneously set to the lowest can be implemented.

In potential control for the second electrode 12, the second electrode 12 needs to be divided into sub-pixel units. However, with control using the first electrodes 11, the sensitivity becomes variable for any sub-pixel unit. For example, when the potentials of the first electrodes 11 are controlled on a per row basis, a rolling shutter, which is a shutter operation on a per row basis, can be implemented.

As illustrated in FIG. 3, in the pixel cell 10, two first electrodes 11, namely, the first electrode 11a and the first electrode 11b, are provided within one lens aperture. The first electrode 11a and the first electrode 11b are respectively connected to the corresponding charge accumulation nodes 41, which are floating diffusion nodes FD1 and FD2. As described above, the potential of the first electrode 11a is controlled by the electrode control circuit 32a, and the potential of the first electrode 11b is controlled by the electrode control circuit 32b. The electrode control circuit 32a and the electrode control circuit 32b may perform different modulations. With this configuration, different modulations can be simultaneously applied to the sub-pixel cell 5a and the sub-pixel cell 5b having the same field of view.

In FIG. 3, the transistors and so on in the sub-pixel cells 5 are omitted.

As illustrated in FIG. 4, in plan view of the pixel cell 10, in the pixel cell 10, the first electrode 11a and the first electrode 11b having the same sizes are arranged side by side for one on-chip micro-lens 202 and one color filter 201. The sizes and/or arrangement of the first electrode 11a and the first electrode 11b are not limited to this. Between the first electrode 11a and the first electrode 11b, a shield electrode for controlling a charge trapping range may be further inserted.

In the description given above, two first electrodes 11, namely, the first electrode 11a and the first electrode 11b, are provided within one lens aperture, and different modulations are performed for the respective electrodes. However, three or more first electrodes 11 may be provided within one lens aperture, and different modulations may be performed for the respective electrodes. In this case, each pixel cell 10 is configured to include a number of sub-pixel cells 5 adjacent to each other in the pixel array PA (for example, arranged in series in the row direction or the column direction of the pixel array PA), the number being equal to the number of first electrodes 11 included in the pixel cell 10.

Figure 6:
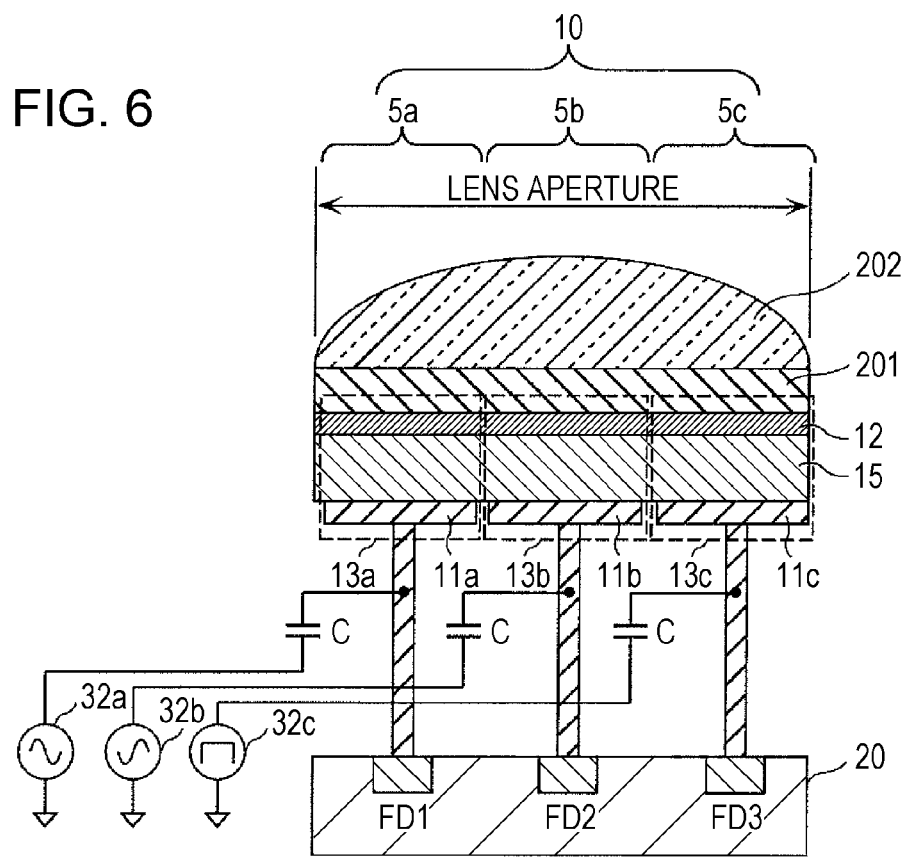
FIG. 6 is a cross-sectional view of an example pixel cell.
Figure 7:
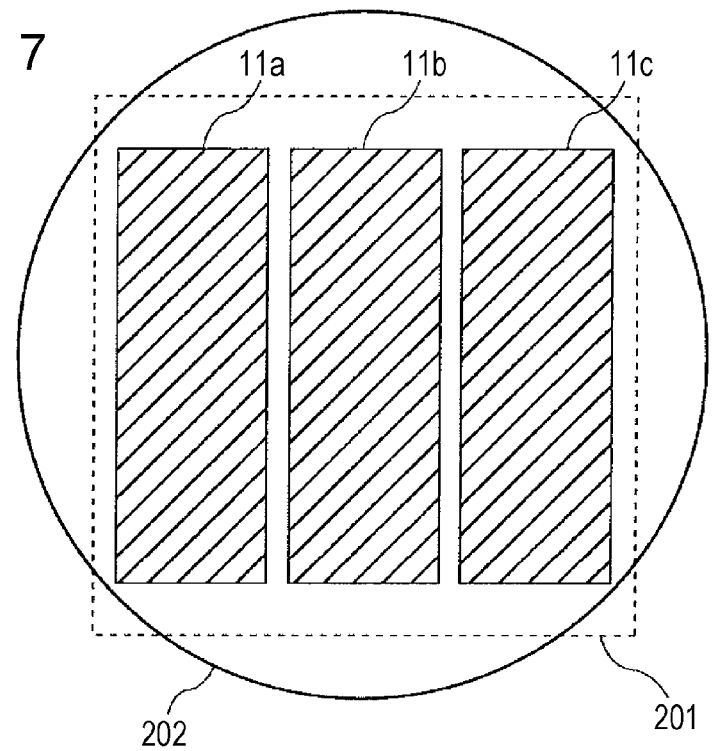
FIG. 7 is a plan view of an example pixel cell.

FIG. 6 is a cross-sectional view of an example of the pixel cell 10 that includes three first electrodes 11 within one lens aperture and in which three different modulations are performed for the respective first electrodes 11. FIG. 7 is a plan view of the example of the pixel cell 10 illustrated in FIG. 6.

As illustrated in FIG. 7, in plan view of the pixel cell 10, in the pixel cell 10, the first electrode 11a, the first electrode 11b, and a first electrode 11c having the same sizes are arranged side by side linearly at equal intervals for one on-chip micro-lens 202 and one color filter 201. The sizes and/or arrangement of the first electrode 11a, the first electrode 11b, and the first electrode 11c are not limited to this. Between the first electrode 11a and the first electrode 11b and between the first electrode 11b and the first electrode 11c, a shield electrode for controlling a charge trapping range may be further inserted. With this configuration, three modulations can be simultaneously applied to the same spatial information.

Figure 8:
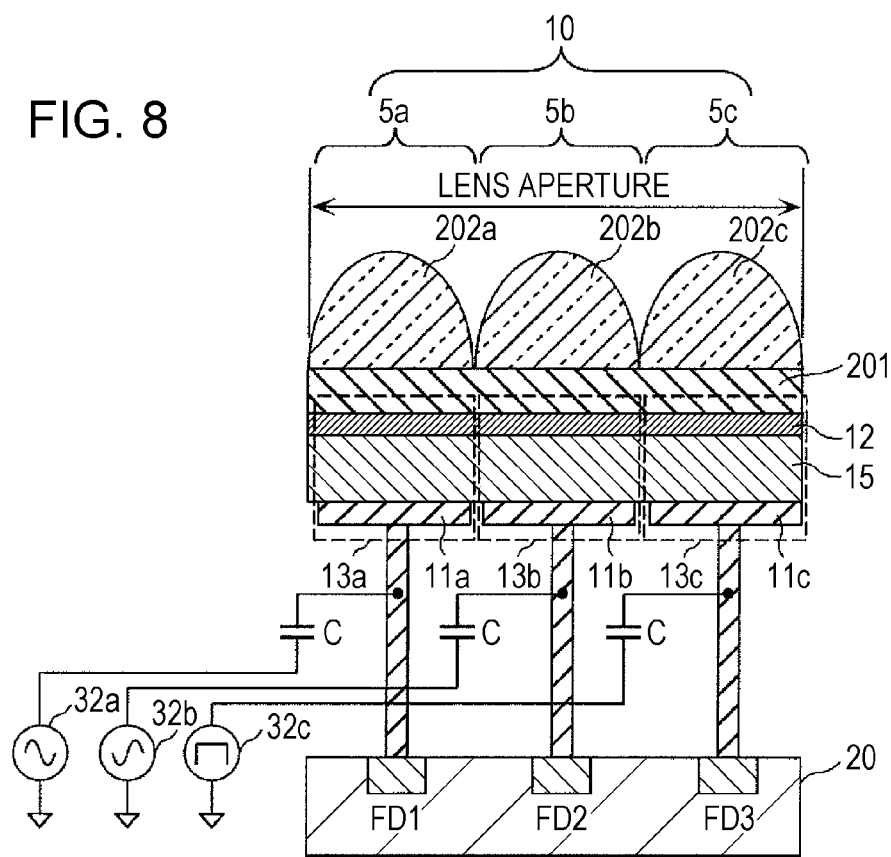
FIG. 8 is a cross-sectional view of an example pixel cell.
Figure 9:
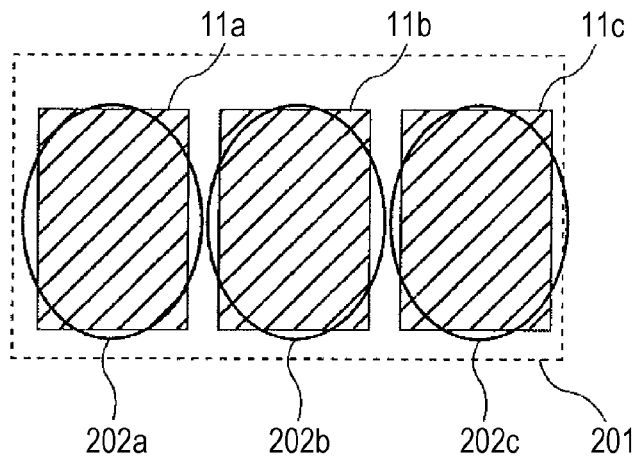
FIG. 9 is a plan view of an example pixel cell.

In the description given above, one on-chip micro-lens 202 is disposed for the plural first electrodes 11; however, the on-chip micro-lens 202 may be disposed for each of the plural first electrodes 11. FIG. 8 is a cross-sectional view of an example of the pixel cell 10 in which the on-chip micro-lenses 202 (here, an on-chip micro-lens 202a, an on-chip micro-lens 202b, and an on-chip micro-lens 202c) are respectively disposed for the plural first electrodes 11 (here, the first electrode 11a, the first electrode 11b, and the first electrode 11c). FIG. 9 is a plan view of the example of the pixel cell 10 illustrated in FIG. 8. In such a configuration, only one charge amount (modulation information) can be obtained for the aperture of each on-chip micro-lens 202. However, the sub-pixel cells 5 adjacent to each other have substantially the equivalent fields of view and have the same color filter, and therefore, plural charge amounts for the equivalent field of view can be obtained.

Now, a three-dimensional motion estimation method using charge amounts obtained by the charge amount obtaining circuit 120 is described. Here, a description is given under the assumption that each pixel cell 10 includes three first electrodes 11, namely, the first electrode 11a, the first electrode 11b, and the first electrode 11c, that is, includes three sub-pixel cells 5, namely, the sub-pixel cell 5a, the sub-pixel cell 5b, and the sub-pixel cell 5c, within one lens aperture, as illustrated in FIG. 6 and FIG. 7.

Figure 10:
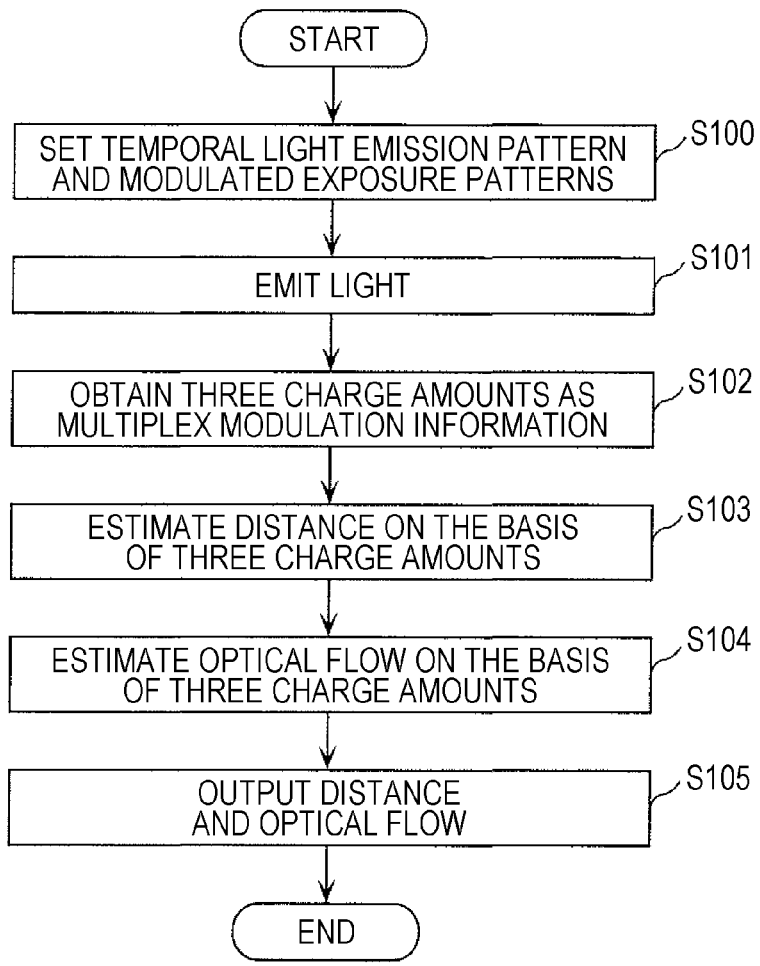
FIG. 10 is a flowchart illustrating example processing in the three-dimensional motion obtaining apparatus according to the first embodiment.

FIG. 10 is a flowchart illustrating example processing (hereinafter, this processing may be referred to as "first processing") in the three-dimensional motion obtaining apparatus 1 according to this embodiment.

Figure 11:
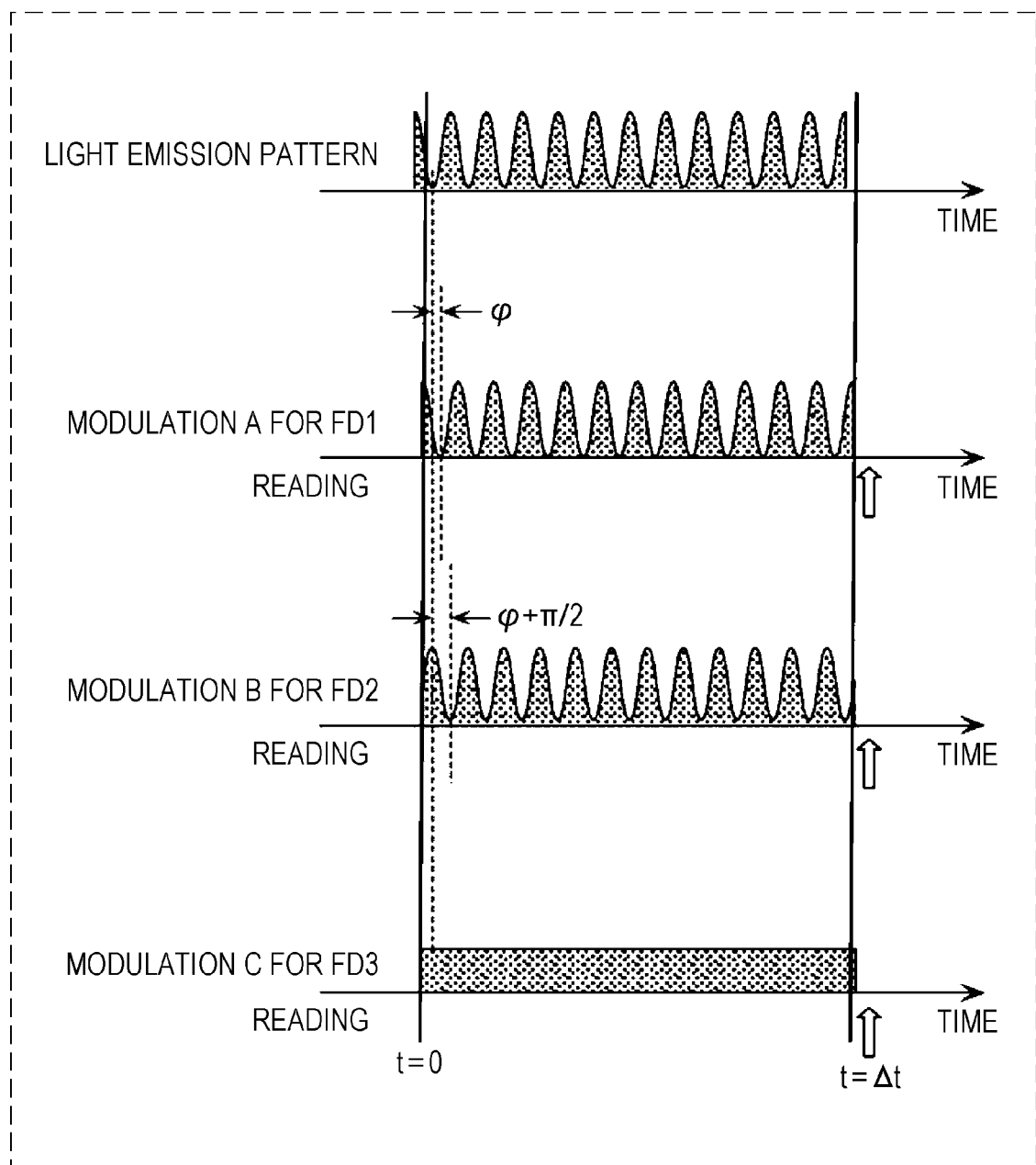
FIG. 11 is a schematic diagram illustrating relations between a temporal light emission pattern and modulated exposure patterns.

FIG. 11 is a schematic diagram illustrating relations between a temporal light emission pattern for the light source 110 and modulated exposure patterns for each pixel cell 10.

Step S100

The control unit 131 reads a temporal light emission pattern from a memory not illustrated and instructs the light source 110 to emit light in accordance with the read temporal light emission pattern. The control unit 131 reads modulated exposure patterns respectively corresponding to the electrode control circuit 32a, the electrode control circuit 32b, and the electrode control circuit 32c from a memory not illustrated and instructs the electrode control circuit 32a, the electrode control circuit 32b, and the electrode control circuit 32c to generate modulated signals in accordance with the respective corresponding read modulated exposure patterns.

The control unit 131 controls output of the temporal light emission pattern and the modulated exposure patterns. The control unit 131 controls output of the temporal light emission pattern and the modulated exposure patterns so that, for example, the temporal light emission pattern is in synchronization with the modulated exposure patterns. For example, the control unit 131 may give a specification of the start time of light emission in accordance with the temporal light emission pattern to the light source 110, give a specification of the start time of generation of a modulated signal in accordance with a corresponding one of the modulated exposure patterns to the electrode control circuit 32a, give a specification of the start time of generation of a modulated signal in accordance with a corresponding one of the modulated exposure patterns to the electrode control circuit 32b, and give a specification of the start time of generation of a modulated signal in accordance with a corresponding one of the modulated exposure patterns to the electrode control circuit 32c.

Step S101

The light source 110 emits light to a subject in accordance with the temporal light emission pattern specified by the control unit 131.

The top graph in FIG. 11 shows a temporal light emission pattern for the light source 110. Here, this example temporal light emission pattern is in a form of a sine wave (sinusoidal wave). In a case where the frequency of the sine wave is high, the resolution of the measurable distance becomes high, but the range of the measurable distance becomes narrow. On the other hand, in a case where the frequency is low, the resolution of the measurable distance becomes low, but the range of the measurable distance becomes wide. The frequency is, for example, 1 MHz or higher and several hundred GHz or lower; however, the frequency is not limited to this.

Step S102

In a state where the light source 110 is irradiating the subject in accordance with the temporal light emission pattern specified by the control unit 131, the charge amount obtaining circuit 120 obtains charge amounts (multiplex modulation information) of three different sub-pixel cells within one aperture in accordance with the modulated exposure patterns specified by the control unit 131. The second to fourth graphs from the top of FIG. 11 respectively show three modulated exposure patterns set by the control unit 131.

As illustrated in FIG. 11, each of the modulated exposure patterns has a fixed time segment. In each of the modulated exposure patterns, an exposure sensitivity is associated with each time in the time segment. The charge amount obtaining circuit 120 obtains, for each pixel cell 10, a first charge amount of the sub-pixel cell 5a under a first modulated exposure pattern, a second charge amount of the sub-pixel cell 5b under a second modulated exposure pattern, and a third charge amount of the sub-pixel cell 5c under a third modulated exposure pattern. Specifically, these three modulated exposure patterns are as described below.

Pattern 1: The first modulated exposure pattern is a signal having the same frequency as that of the temporal light emission pattern and having a phase different from that of the temporal light emission pattern. The first modulated exposure pattern has a bias so as not to have a negative value.

Pattern 2: The second modulated exposure pattern is a signal having the same frequency and bias as those of the first modulated exposure pattern and having a phase different from that of the first modulated exposure pattern. For example, the phase of the second modulated exposure pattern is different from the phase of the first modulated exposure pattern by 90 degrees. The second modulated exposure pattern may be a signal having the same frequency and bias as those of the first modulated exposure pattern and having a phase different from that of the first modulated exposure pattern and different from that of the temporal light emission pattern.

Pattern 3: This is a signal having the bias component of the first modulated exposure pattern.

Step S103

The distance estimation unit 132 estimates the distance to the subject on the basis of the first charge amount of the sub-pixel cell 5a, the second charge amount of the sub-pixel cell 5b, and the third charge amount of the sub-pixel cell 5c, which are charge amounts of three different sub-pixel cells within one aperture obtained by the charge amount obtaining circuit 120.

Step S104

The optical flow estimation unit 133 estimates an optical flow that represents a motion of the subject on an image on the basis of the first charge amount of the sub-pixel cell 5a, the second charge amount of the sub-pixel cell 5b, and the third charge amount of the sub-pixel cell 5c, which are charge amounts of three different sub-pixel cells within one aperture obtained by the charge amount obtaining circuit 120.

Step S105

The output unit 134 integrates the distance estimated by the distance estimation unit 132 and the optical flow estimated by the optical flow estimation unit 133 and outputs three-dimensional motion information about the subject.

Now, the details of the process in step S103 and that in step S104 are described.

First, a method for estimating distance information in step S103 is described. The temporal light emission pattern L(t) in the light source 110 is expressed by the following expression.

$$L(t) = \cos\left(\frac{2\pi N}{\Delta t} t + \varphi\right) + 1 \qquad \text{(expression 1)}$$

Here, $\Delta t$ represents the reciprocal of the frame rate, $\varphi$ represents a phase difference indicating the time difference from the frame timing, and N represents the number of cycle of the light emission pattern in one frame (N=12 in FIG. 11). As described above, the frequency N of the light emission pattern needs to range from about megahertz to gigahertz. In expression 1, the intensity of the light source 110 is normalized to a value from 0 to 2; however, the intensity range may be any range, as a matter of course.

In a case where this light is reflected by a subject, it is expected that a signal represented by Ls(t) below arrives at the charge amount obtaining circuit 120.

$$Ls(t) = \cos\frac{2\pi N}{\Delta t}(t + \varphi + \theta) + 1 \qquad \text{(expression 2)}$$

Here, $\theta$ represents a delay amount dependent on the distance L1 between the light source 110 and the subject and the distance L2 between the subject and the charge amount obtaining circuit 120 and satisfies the following relation.

$$L1 + L2 = v_c \theta \qquad \text{(expression 3)}$$

Here, $v_c$ is equal to 299,792,458 [m/sec], which is the speed of light. If it is assumed that the position of the light source 110 and that of the charge amount obtaining circuit 120 are substantially the same, the distance L between the charge amount obtaining circuit 120 and the subject can be expressed by the following expression.

$$L = \frac{v_c \theta}{2} \qquad \text{(expression 4)}$$

That is, when the delay amount $\theta$ is estimated, the distance L to the subject can be estimated.

Here, the control unit 131 sets the three modulated exposure patterns s0(t), s1(t), and s2(t) for the charge amount obtaining circuit 120 as expressed by the following expressions.

$$s0(t) = 1, \qquad \text{(expression 5)}$$
$$s1(t) = \cos\left(\frac{2\pi N}{\Delta t} t\right) + 1,$$
$$s2(t) = \sin\left(\frac{2\pi N}{\Delta t} t\right) + 1$$

In expressions 5, the three modulated exposure patterns for the charge amount obtaining circuit 120 are normalized to values from 0 to 2; however, the patterns need not be within this range, as a matter of course.

When the three modulated exposure patterns are expressed by expressions 5, the three charge amounts fs0, fs1, and fs2 obtained by the charge amount obtaining circuit 120 are expressed as follows.

$$fs0 = \int_0^{\Delta t} Ls(t) \cdot s0(t)\, dt \qquad \text{(expression 6)}$$
$$= \int_0^{\Delta t} \left[\left\{\cos\frac{2\pi N}{\Delta t}(t + \varphi + \theta) + 1\right\} \cdot 1\right] dt$$
$$= \Delta t$$

$$\begin{aligned}fs1 &= \int_0^{\Delta t} Ls(t) \cdot s1(t)\, dt \quad \text{(expression 7)}\\
&= \int_0^{\Delta t} \left[\left\{\cos\frac{2\pi N}{\Delta t}(t + \varphi + \theta) + 1\right\} \cdot \left\{\cos\left(\frac{2\pi N}{\Delta t}t\right) + 1\right\}\right] dt\\
&= \int_0^{\Delta t} \left\{\cos\left(\frac{2\pi N}{\Delta t}t\right)\cos\frac{2\pi N}{\Delta t}(\varphi + \theta) - \sin\left(\frac{2\pi N}{\Delta t}t\right)\sin\frac{2\pi N}{\Delta t}(\varphi + \theta) + 1\right\} \cdot\\
&\qquad \left\{\cos\left(\frac{2\pi N}{\Delta t}t\right) + 1\right\} dt\\
&= \int_0^{\Delta t} \left\{\cos^2\left(\frac{2\pi N}{\Delta t}t\right)\cos\frac{2\pi N}{\Delta t}(\varphi + \theta) + \cos\left(\frac{2\pi N}{\Delta t}t\right)\cos\frac{2\pi N}{\Delta t}(\varphi + \theta) -\right.\\
&\qquad \sin\left(\frac{2\pi N}{\Delta t}t\right)\cos\left(\frac{2\pi N}{\Delta t}t\right)\sin\frac{2\pi N}{\Delta t}(\varphi + \theta) - \sin\left(\frac{2\pi N}{\Delta t}t\right)\sin\frac{2\pi N}{\Delta t}(\varphi + \theta) +\\
&\qquad \left.\cos\left(\frac{2\pi N}{\Delta t}t\right) + 1\right\} dt\\
&= \int_0^{\Delta t} \left\{\cos^2\left(\frac{2\pi N}{\Delta t}t\right)\cos\frac{2\pi N}{\Delta t}(\varphi + \theta) + 1\right\} dt\\
&= \int_0^{\Delta t} \left\{\frac{1}{2}\left(1 + \cos 2\left(\frac{2\pi N}{\Delta t}t\right)\right)\cos\frac{2\pi N}{\Delta t}(\varphi + \theta) + 1\right\} dt\\
&= \int_0^{\Delta t} \left\{\frac{1}{2}\cos\frac{2\pi N}{\Delta t}(\varphi + \theta) + 1\right\} dt\\
&= \frac{\Delta t}{2}\cos\frac{2\pi N}{\Delta t}(\varphi + \theta) + \Delta t\end{aligned}$$

$$\begin{aligned}fs2 &= \int_0^{\Delta t} Ls(t) \cdot s2(t)\, dt \quad \text{(expression 8)}\\
&= \int_0^{\Delta t} \left[\left\{\cos\frac{2\pi N}{\Delta t}(t + \varphi + \theta) + 1\right\} \cdot \left\{\sin\left(\frac{2\pi N}{\Delta t}t\right) + 1\right\}\right] dt\\
&= \int_0^{\Delta t} \left\{\cos\left(\frac{2\pi N}{\Delta t}t\right)\cos\frac{2\pi N}{\Delta t}(\varphi + \theta) - \sin\left(\frac{2\pi N}{\Delta t}t\right)\sin\frac{2\pi N}{\Delta t}(\varphi + \theta) + 1\right\} \cdot\\
&\qquad \left\{\sin\left(\frac{2\pi N}{\Delta t}t\right) + 1\right\} dt\\
&= \int_0^{\Delta t} \left\{\cos\left(\frac{2\pi N}{\Delta t}t\right)\sin\left(\frac{2\pi N}{\Delta t}t\right)\cos\frac{2\pi N}{\Delta t}(\varphi + \theta) +\right.\\
&\qquad \cos\left(\frac{2\pi N}{\Delta t}t\right)\cos\frac{2\pi N}{\Delta t}(\varphi + \theta) - \sin^2\left(\frac{2\pi N}{\Delta t}t\right)\sin\frac{2\pi N}{\Delta t}(\varphi + \theta) -\\
&\qquad \left.\sin\left(\frac{2\pi N}{\Delta t}\right)\sin\frac{2\pi N}{\Delta t}(\varphi + \theta) + \sin\left(\frac{2\pi N}{\Delta t}t\right) + 1\right\} dt\\
&= \int_0^{\Delta t} \left\{-\sin^2\left(\frac{2\pi N}{\Delta t}t\right)\sin\frac{2\pi N}{\Delta t}(\varphi + \theta) + 1\right\} dt\\
&= \int_0^{\Delta t} \left\{\frac{1}{2}\left(\cos 2\left(\frac{2\pi N}{\Delta t}t\right) - 1\right)\sin\frac{2\pi N}{\Delta t}(\varphi + \theta) + 1\right\} dt\\
&= \int_0^{\Delta t} \left\{-\frac{1}{2}\sin\frac{2\pi N}{\Delta t}(\varphi + \theta) + 1\right\} dt\\
&= \frac{\Delta t}{2}\sin\frac{2\pi N}{\Delta t}(\varphi + \theta) + \Delta t\end{aligned}$$

Therefore, the following mathematical relation holds.

$$\frac{fs2 - fs0}{fs1 - fs0} = \frac{\sin\frac{2\pi N}{\Delta t}(\varphi + \theta)}{\cos\frac{2\pi N}{\Delta t}(\varphi + \theta)} = \tan\frac{2\pi N}{\Delta t}(\varphi + \theta) \quad \text{(expression 9)}$$

Here, φ is a parameter controllable by the control unit 131 and is known. Therefore, θ, which is distance information about the subject, can be estimated by using expression 9. In this method, it is not possible to detect a phase difference that is equal to or larger than one cycle, and the distance range that can be estimated is expressed as follows.

$$0 \leq L \leq \frac{v_c}{2N} \quad \text{(expression 10)}$$

Therefore, the control unit 131 can calculate an optimum temporal light emission pattern and optimum modulated exposure patterns from the necessary distance range. For example, in a case of using a 1 GHz pattern, the detection range is up to about 15 cm. In a case of using a 100 MHz pattern, detection is possible for up to about 150 cm. In a case of using a 10 MHz pattern, detection is possible for up to about 15 m. In a case of using a 1 MHz pattern, detection is possible for up to about 150 m. Accordingly, when the wavelength is appropriately set, a distance within the necessary range can be estimated.

Next, a method for estimating an optical flow by the optical flow estimation unit 133 in step S104 is described.

The temporal light emission pattern L(t) in the light source 110 is similarly expressed by expression 1, and the three modulated exposure patterns s0(t), s1(t), and s2(t) for the charge amount obtaining circuit 120 are similarly expressed by expressions 5.

A method for estimating an optical flow using an optical flow constraint equation is described. The brightness value for pixel coordinates (x, y) on an image at time t is represented by f(x, y, t). If it is assumed that the brightness of the subject does not change between frames, the following optical flow constraint equation holds.

$$\left(\frac{\partial}{\partial t} + v_x \frac{\partial}{\partial x} + v_y \frac{\partial}{\partial y}\right) f = 0 \quad \text{(expression 11)}$$

Here, if it is assumed that a change in the brightness of each pixel over a very short time Δt is constant, the following mathematical relation holds.

$$\begin{aligned}&\frac{1}{\Delta t}(f(x, y, \Delta t) - f(x, y, 0)) + \quad \text{(expression 12)}\\
&\frac{v_x}{\Delta x}(f(x + \Delta x, y, 0) - f(x, y, 0)) +\\
&\frac{v_y}{\Delta y}(f(x, y + \Delta y, 0) - f(x, y + \Delta y, 0)) = 0\end{aligned}$$

Note that $(v_x, v_y)$ represents the optical flow for the pixel coordinates (x, y) on the image. When this expression is rewritten, the following mathematical relation is obtained.

$$\begin{aligned}&\left[\frac{1}{\Delta x}(f(x + \Delta x, y, 0) - f(x, y, 0))\frac{1}{\Delta y}\right. \quad \text{(expression 13)}\\
&\left.(f(x, y + \Delta y, 0) - f(x, y + \Delta y, 0))\right]\begin{bmatrix}v_x\\v_y\end{bmatrix} =\\
&-\frac{1}{\Delta t}(f(x, y, \Delta t) - f(x, y, 0))\end{aligned}$$

For the two unknowns $v_x$ and $v_y$ in expression 13, only one equation is present. Therefore, it is not possible to solve the equation as is. Accordingly, in an optical flow estimation method in the related art using an optical flow constraint equation, the optical flow is estimated by giving some constraint condition that, for example, the optical flow does not significantly change in neighborhoods or is sparse in addition to this equation. Therefore, a prerequisite that is different from the actual condition is necessary, which is a cause of a decrease in estimation accuracy.

The right side of expression 13 represents a time differential of the brightness value f(x, y, t) on the image. Usually, Δt is assumed to be the inter-frame time, and a calculation is performed from temporally different two frames. That is, it is assumed here that a change in the brightness of each pixel is constant between frames. However, this assumption does not hold for a subject that includes, for example, an edge and is a cause of a degraded result of optical flow estimation.

As described above, an optical flow estimation method in the related art using an optical flow constraint equation has the following two issues.

Issue 1: Some constraint condition is necessary in addition to an optical flow constraint equation.

Issue 2: It is assumed that a change in the brightness of each pixel is constant between frames.

On the other hand, the optical flow estimation unit 133 according to this embodiment addresses the above-described two issues by using three charge amounts obtained by the charge amount obtaining circuit 120.

Here, when it is assumed that a charge amount is obtained under a modulated exposure pattern s(t), the optical flow constraint equation is as follows.

$$\int_0^{\Delta t} \frac{\partial}{\partial t} f \cdot s(t) dt + \frac{1}{\Delta x}(fs(x+\Delta x, y, 0) - fs(x, y, 0))v_x + \frac{1}{\Delta y}(fs(x, y+\Delta y, 0) - fs(x, y, 0))v_y = 0 \quad \text{(expression 14)}$$

At this time, with modulated exposure, the condition of the optical flow constraint equation that "the brightness of a subject does not change between frames" does not seem to be satisfied; however, this is not true. This is because, although integration processing is performed in the first term of expression 14, it can be assumed that the brightness is constant in this very small segment.

When integration by parts $$\int_a^b u(x)v'(x)dx = [u(x)v(x)]_a^b - \int_a^b u'(x)v(x)dx \quad \text{(expression 15)}$$

is used, expression 14 is modified as follows.

$$\int_0^{\Delta t} \frac{\partial}{\partial t} f \cdot s(t) dt = [s(t)f(t)]_0^{\Delta t} - \int_0^{\Delta t} \left\{\frac{\partial}{\partial t} s(t)\right\} \cdot f(t) dt \quad \text{(expression 16)}$$

Therefore, when the modulated exposure patterns s0(t), s1(t), and s2(t) expressed by expressions 5 are used, the following mathematical relations hold for the three charge amounts fs0, fs1, and fs2 obtained by the charge amount obtaining circuit 120, $$\int_0^{\Delta t} \frac{\partial}{\partial t} f \cdot s1(t) dt = [s1(t)f(t)]_0^{\Delta t} - \int_0^{\Delta t} \frac{\partial}{\partial t} s1(t) \cdot f(t) dt = \quad \text{(expression 17)}$$

$$-\int_0^{\Delta t} \frac{\partial}{\partial t}\left\{\cos\left(\frac{2\pi N}{\Delta t} t\right) + 1\right\} \cdot f(t) dt =$$

$$\int_0^{\Delta t} \left\{\frac{2\pi N}{\Delta t} \sin\left(\frac{2\pi N}{\Delta t} t\right)\right\} \cdot f(t) dt =$$

$$\frac{2\pi N}{\Delta t}\left[\int_0^{\Delta t}\left\{\sin\left(\frac{2\pi N}{\Delta t} t\right) + 1\right\} \cdot f(t) dt - \int_0^{\Delta t} f(t) dt\right] =$$

$$\frac{2\pi N}{\Delta t}(fs2 - fs0)$$

$$\int_0^{\Delta t} \frac{\partial}{\partial t} f \cdot s2(t) dt = [s2(t)f(t)]_0^{\Delta t} - \int_0^{\Delta t} \frac{\partial}{\partial t} s2(t) \cdot f(t) dt = \quad \text{(expression 18)}$$

$$-\int_0^{\Delta t} \frac{\partial}{\partial t}\left\{\sin\left(\frac{2\pi N}{\Delta t} t\right) + 1\right\} \cdot f(t) dt =$$

$$-\int_0^{\Delta t} \frac{2\pi}{\Delta t}\cos\left(\frac{2\pi N}{\Delta t} t\right) \cdot f(t) dt =$$

$$\frac{2\pi N}{\Delta t}\left[\int_0^{\Delta t}\left\{1 - \cos\left(\frac{2\pi N}{\Delta t} t\right)\right\} \cdot f(t) dt - \int_0^{\Delta t} f(t) dt\right] = \frac{2\pi N}{\Delta t}(fs1 - fs0),$$

where $$fs0 = \int_0^{\Delta t} \frac{\partial}{\partial t} f \cdot s0(t) dt \int_0^{\Delta t} f(t) dt \quad \text{(expression 19)}$$

$$fs1 \int_0^{\Delta t} \frac{\partial}{\partial t} f \cdot s1(t) dt = \int_0^{\Delta t} \left\{\cos\left(\frac{2\pi N}{\Delta t} t\right) + 1\right\} \cdot f(t) dt$$

$$fs2 \int_0^{\Delta t} \frac{\partial}{\partial t} f \cdot s2(t) dt = \int_0^{\Delta t} \left\{\sin\left(\frac{2\pi N}{\Delta t} t\right) + 1\right\} \cdot f(t) dt.$$

On the basis of expression 14, expression 18, and expressions 19, the following mathematical relations are derived.

$$\frac{2\pi N}{\Delta t}(fs2 - fs0) + \frac{1}{\Delta x}(fs1(x+\Delta x, y, 0) - fs1(x, y, 0))v_x + \quad \text{(expression 20)}$$

$$\frac{1}{\Delta y}(fs1(x, y+\Delta y, 0) - fs1(x, y, 0))v_y = 0$$

$$\frac{2\pi N}{\Delta t}(fs1 - fs0) + \frac{1}{\Delta x}(fs2(x+\Delta x, y, 0) - fs2(x, y, 0))v_x +$$

$$\frac{1}{\Delta y}(fs2(x, y+\Delta y, 0) - fs2(x, y, 0))v_y = 0$$

These expressions are rewritten as follows.

$$\begin{bmatrix} \frac{1}{\Delta x}(fs1(x+\Delta x, y, 0) - fs1(x, y, 0)) & \frac{1}{\Delta y}(fs1(x, y+\Delta y) - fs1(x, y, 0)) \\ \frac{1}{\Delta x}(fs2(x+\Delta x, y, 0) - fs2(x, y, 0)) & \frac{1}{\Delta y}(fs2(x, y+\Delta y) - fs2(x, y, 0)) \end{bmatrix} \quad \text{(expression 21)}$$

$$\begin{bmatrix} v_x \\ v_y \end{bmatrix} = \begin{bmatrix} \frac{2\pi N}{\Delta t}(fs0 - fs2) \\ \frac{2\pi N}{\Delta t}(fs0 - fs1) \end{bmatrix}$$

For the two unknowns $v_x$ and $v_y$ in this expression, two equations are present. Therefore, the optical flow can be estimated without giving any constraint condition. Accordingly, the optical flow estimation unit 133 according to this embodiment can estimate the optical flow from one image by obtaining three charge amounts resulting from the subject. Furthermore, the assumption that a change in the brightness of each pixel is constant between frames is not used, and therefore, estimation with high accuracy can be performed. In addition, among constraint equations, only an optical flow constraint equation is used and the other constraint equations are not used, and therefore, more accurate optical flow estimation can be performed.

In the description given above, the distance estimation unit 132 first estimates the distance, and thereafter, the optical flow estimation unit 133 estimates the optical flow. However, these processes may be performed in the inverse order or may be performed in parallel. As a matter of course, these processes are repeatedly performed, and the process by the distance estimation unit 132 and the process by the optical flow estimation unit 133 may be performed in the inverse order.

As described above, in the three-dimensional motion obtaining apparatus 1 according to this embodiment, the charge amount obtaining circuit 120 obtains three different charge amounts within one aperture so that highly accurate three-dimensional motion information can be obtained.

The above-described example is the example where each pixel cell 10 includes three first electrodes 11, namely, the first electrode 11a, the first electrode 11b, and the first electrode 11c, that is, includes three sub-pixel cells 5, namely, the sub-pixel cell 5a, the sub-pixel cell 5b, and the sub-pixel cell 5c, within one lens aperture.

Now, the example as illustrated in FIG. 3 and FIG. 4 is described below where each pixel cell 10 includes two first electrodes 11, namely, the first electrode 11a and the first electrode 11b, that is, includes two sub-pixel cells 5, namely, the sub-pixel cell 5a and the sub-pixel cell 5b, within one lens aperture. In this example, the process by the distance estimation unit 132 and the process by the optical flow estimation unit 133 are switched in a time-division manner and performed.

Here, as in the first processing, a description is given under the assumption that the distance estimation unit 132 estimates the distance, and thereafter, the optical flow estimation unit 133 estimates the optical flow. As a matter of course, these processes are repeatedly performed, and the process by the distance estimation unit 132 and the process by the optical flow estimation unit 133 may be performed in the inverse order.

Figure 12:
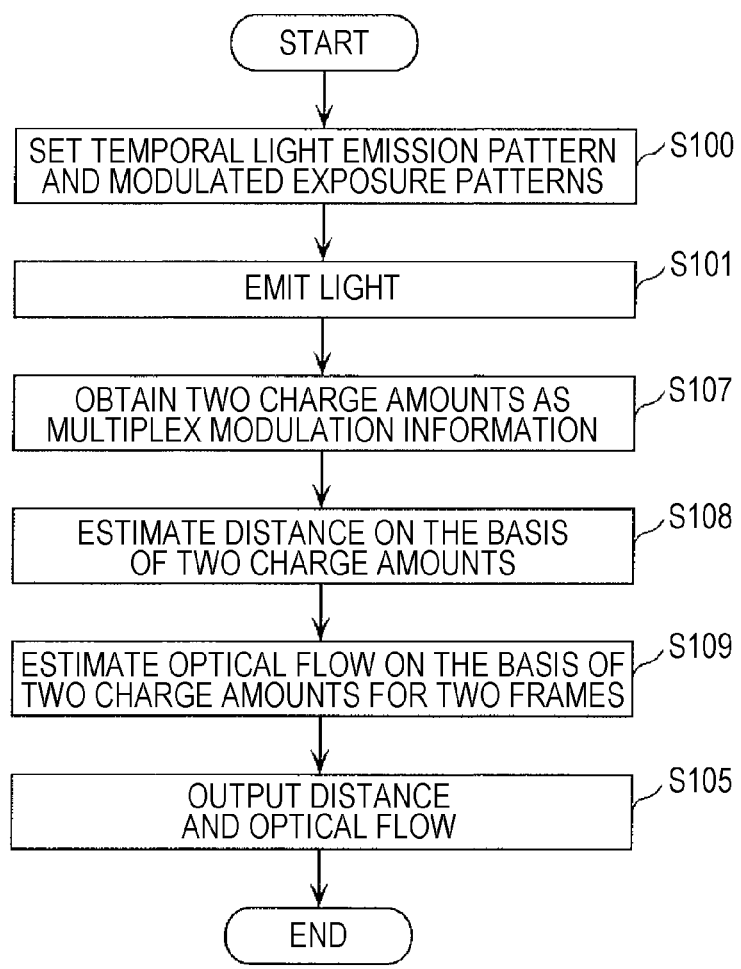
FIG. 12 is a flowchart illustrating example processing in the three-dimensional motion obtaining apparatus according to the first embodiment.

FIG. 12 is a flowchart illustrating example processing in the three-dimensional motion obtaining apparatus 1 for obtaining two different charge amounts within one aperture. In FIG. 12, constituent elements that are the same as those in FIG. 10 are given the same reference numerals.

Figure 13:
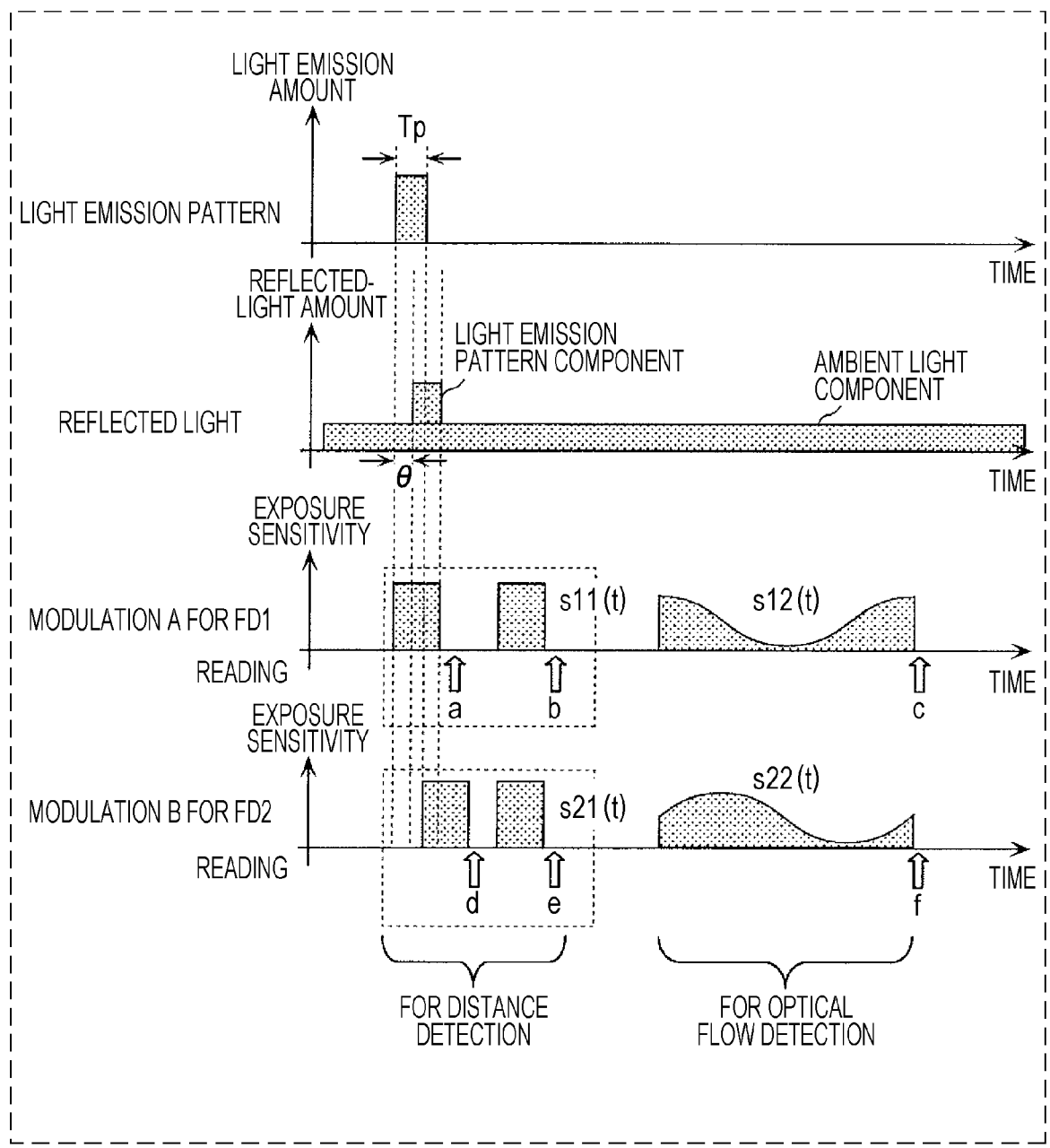
FIG. 13 is a schematic diagram illustrating relations between a temporal light emission pattern, a reflected-light pattern, and modulated exposure patterns.

FIG. 13 is a schematic diagram illustrating relations between a temporal light emission pattern for the light source 110, a reflected-light pattern of light reflected by a subject, and modulated exposure patterns for each pixel cell 10. As described below, in the temporal light emission pattern for the light source 110, a temporal modulation pattern for distance detection and a temporal modulation pattern for optical flow detection are repeated.

Step S100

The control unit 131 reads a temporal light emission pattern from a memory not illustrated and instructs the light source 110 to emit light in accordance with the read temporal light emission pattern. The control unit 131 reads modulated exposure patterns respectively corresponding to the electrode control circuit 32a and the electrode control circuit 32b from a memory not illustrated and instructs the electrode control circuit 32a and the electrode control circuit 32b to generate modulated signals in accordance with the respective corresponding read modulated exposure patterns.

The control unit 131 controls output of the temporal light emission pattern and the modulated exposure patterns. The control unit 131 controls output of the temporal light emission pattern and the modulated exposure patterns so that, for example, the temporal light emission pattern is in synchronization with the modulated exposure patterns. For example, the control unit 131 may give a specification of the start time of light emission in accordance with the temporal light emission pattern to the light source 110, give a specification of the start time of generation of a modulated signal in accordance with a corresponding one of the modulated exposure patterns to the electrode control circuit 32a, and give a specification of the start time of generation of a modulated signal in accordance with a corresponding one of the modulated exposure patterns to the electrode control circuit 32b.

Step S101

The light source 110 emits light to a subject in accordance with the temporal light emission pattern for distance detection specified by the control unit 131. The top graph in FIG. 13 shows a temporal light emission pattern for the light source 110 at this time. Here, the temporal light emission pattern is in a form of a rectangular wave, and the time width thereof is Tp [sec]. Light emitted by the light source 110 is reflected by the subject and returns to the charge amount obtaining circuit 120 with a delay θ that is dependent on the sum L of the distance L1 between the light source 110 and the subject and the distance L2 between the subject and the charge amount obtaining circuit 120. Here, the reflected light that returns to the charge amount obtaining circuit 120 is affected not only by the light source 110 but also by an external light component. The second graph from the top of FIG. 13 schematically shows such a reflected-light component. Here, it is assumed that the external light component remains constant regardless of the exposure time.

Step S107

In a state where the light source 110 is irradiating the subject in accordance with the temporal light emission pattern specified by the control unit 131, the charge amount obtaining circuit 120 obtains charge amounts (multiplex modulation information) of two different sub-pixel cells within one aperture in accordance with the modulated exposure patterns specified by the control unit 131. In the modulated exposure pattern corresponding to each of the FDs, the modulated exposure pattern for distance detection (s11(t) for the FD1 or s21(t) for the FD2) and the modulated exposure pattern for optical flow detection (s12(t) for the FD1 or s22(t) for the FD2) are temporally switched. The third and fourth graphs from the top of FIG. 13 respectively show two modulated exposure patterns set by the control unit 131.

As illustrated in FIG. 13, each of the modulated exposure patterns has a fixed time segment. In each of the modulated exposure patterns, an exposure sensitivity is associated with each time in the time segment. The charge amount obtaining circuit 120 obtains, for each pixel cell 10, a first charge amount of the sub-pixel cell 5a under a first modulated exposure pattern and a second charge amount of the sub-pixel cell 5b under a second modulated exposure pattern. Here, it is assumed that modulated exposure for distance detection is performed in the first half and that modulated exposure for optical flow detection is performed in the second half. First, modulated exposure for the FD1 included in the sub-pixel cell 5a under the distance detection modulated pattern s11(t) is performed at the same timing at which the light source 110 emits light, and the exposure is stopped a predetermined time period thereafter (FIG. 13). A charge amount obtained at this time is represented by sf11. Furthermore, in a time period during which there is no effect of light emitted from the light source 110, the second exposure is performed for the same exposure period. A charge amount obtained at this time is represented by sf12. Similarly, modulated exposure for the FD2 included in the sub-pixel cell 5b under the TOF modulated pattern s21(t) is performed at the same timing at which the light source 110 stops emitting light, and the exposure is stopped the predetermined time period thereafter. A charge amount obtained at this time is represented by sf21. Furthermore, in a time period during which there is no effect of light emitted from the light source 110, the second exposure is performed for the same exposure period. A charge amount obtained at this time is represented by sf22. The second exposure for the FD2 may be performed for the same exposure period as that of the second exposure for the FD1.

Here, the first exposure for both the FD1 and the FD2 is affected by light emitted from the light source 110; however, the second exposure is not affected by light emitted from the light source 110. Therefore, when the difference between the two charge amounts is obtained, light emission pattern components fsp1 and fsp2 from which the effect of ambient light is eliminated can be calculated as follows.

$$fsp1 = sf11 - sf12, \; fsp2 = sf21 - sf22. \quad \text{(expression 22)}$$

As a matter of course, sf12 and sf22 that are not affected by the light emission pattern for the light source 110 may be obtained before sf11 and sf21 are obtained.

Step S108

The distance estimation unit 132 estimates the distance to the subject on the basis of the charge amount of the sub-pixel cell 5a and the charge amount of the sub-pixel cell 5b, which are two different sub-pixel cells within one aperture, obtained by the charge amount obtaining circuit 120. As described above, if it is assumed that the position of the light source 110 and that of the charge amount obtaining circuit 120 are substantially the same, the distance L between the charge amount obtaining circuit 120 and the subject can be expressed by the following expression.

$$L = \frac{v_C \theta}{2} = \frac{v_C \theta Tp}{2} \frac{\theta}{Tp} = \frac{v_C \theta Tp}{2} \frac{fsp2}{fsp1} \quad \text{(expression 23)}$$

As described above, the distance estimation unit 132 according to this embodiment can estimate the distance to the subject by the charge amount obtaining circuit 120 obtaining the charge amount of the sub-pixel cell 5a and the charge amount of the sub-pixel cell 5b, which are two different sub-pixel cells within one aperture.

Step S109

Subsequently, the optical flow estimation unit 133 estimates an optical flow that represents a motion of the subject on an image on the basis of the charge amount of the sub-pixel cell 5a and the charge amount of the sub-pixel cell 5b, which are two different sub-pixel cells within one aperture, obtained by the charge amount obtaining circuit 120. As described above, for the two unknowns $v_x$ and $v_y$ in expression 13, only one equation is present. Therefore, it is not possible to solve the equation as is. Accordingly, in an optical flow estimation method in the related art using an optical flow constraint equation, the optical flow is estimated by giving some constraint condition that, for example, the optical flow does not significantly change in neighborhoods or is sparse in addition to this equation. Therefore, a prerequisite that is different from the actual condition is necessary, which is a cause of a decrease in estimation accuracy.

Here, when it is assumed that a charge amount is obtained under a modulated exposure pattern s(t), the optical flow constraint equation is expressed by expression 14.

Furthermore, when it is assumed that $$\frac{\partial}{\partial t} f(t)$$

is constant for [0, Δt], the following expression holds.

$$\int_0^{\Delta t} \frac{\partial}{\partial t} f \cdot s(t) dt = \frac{1}{\Delta t}(fs(x, y, \Delta t) - fs(x, y, 0)) \quad \text{(expression 24)}$$

Therefore, when a charge amount fs1(t) of the sub-pixel cell 5a for which modulated exposure is performed with the signal s12(t) and a charge amount fs2(t) of the sub-pixel cell 5b for which modulated exposure is performed with the signal s22(t) can be obtained, expression 13 is modified as follows.

$$\begin{bmatrix} \frac{1}{\Delta x}(fs1(x+\Delta x, y, 0) - fs1(x, y, 0)) & \frac{1}{\Delta y}(fs1(x, y+\Delta y, 0) - fs1(x, y, 0)) \\ \frac{1}{\Delta x}(fs2(x+\Delta x, y, 0) - fs2(x, y, 0)) & \frac{1}{\Delta y}(fs2(x, y+\Delta y, 0) - fs2(x, y, 0)) \end{bmatrix} \quad \text{(expression 25)}$$

$$\begin{bmatrix} v_x \\ v_y \end{bmatrix} = \begin{bmatrix} -\frac{1}{\Delta t}(fs1(x, y, \Delta t) - fs1(x, y, 0)) \\ -\frac{1}{\Delta t}(fs2(x, y, \Delta t) - fs2(x, y, 0)) \end{bmatrix}$$

For the two unknowns $v_x$ and $v_y$ in this expression, two equations are present. Therefore, the optical flow can be estimated without giving any constraint condition. Accordingly, when the charge amount of the sub-pixel cell 5a and the charge amount of the sub-pixel cell 5b, which are two charge amounts relating to the subject, are obtained, the optical flow estimation unit 133 according to this embodiment can estimate the optical flow more accurately by using two images and using only an optical flow constraint equation without using other constraint equations.

Step S105

The output unit 134 integrates the distance estimated by the distance estimation unit 132 and the optical flow estimated by the optical flow estimation unit 133 and outputs three-dimensional motion information about the subject.

As described above, the three-dimensional motion obtaining apparatus 1 according to this embodiment can obtain highly accurate three-dimensional motion information by the charge amount obtaining circuit 120 obtaining two different charge amounts within one aperture.

As a matter of course, the two different charge amounts need not be obtained within one aperture and may be obtained from adjacent apertures, as described with reference to FIG. 8 and FIG. 9.

Second Embodiment

Figure 14:
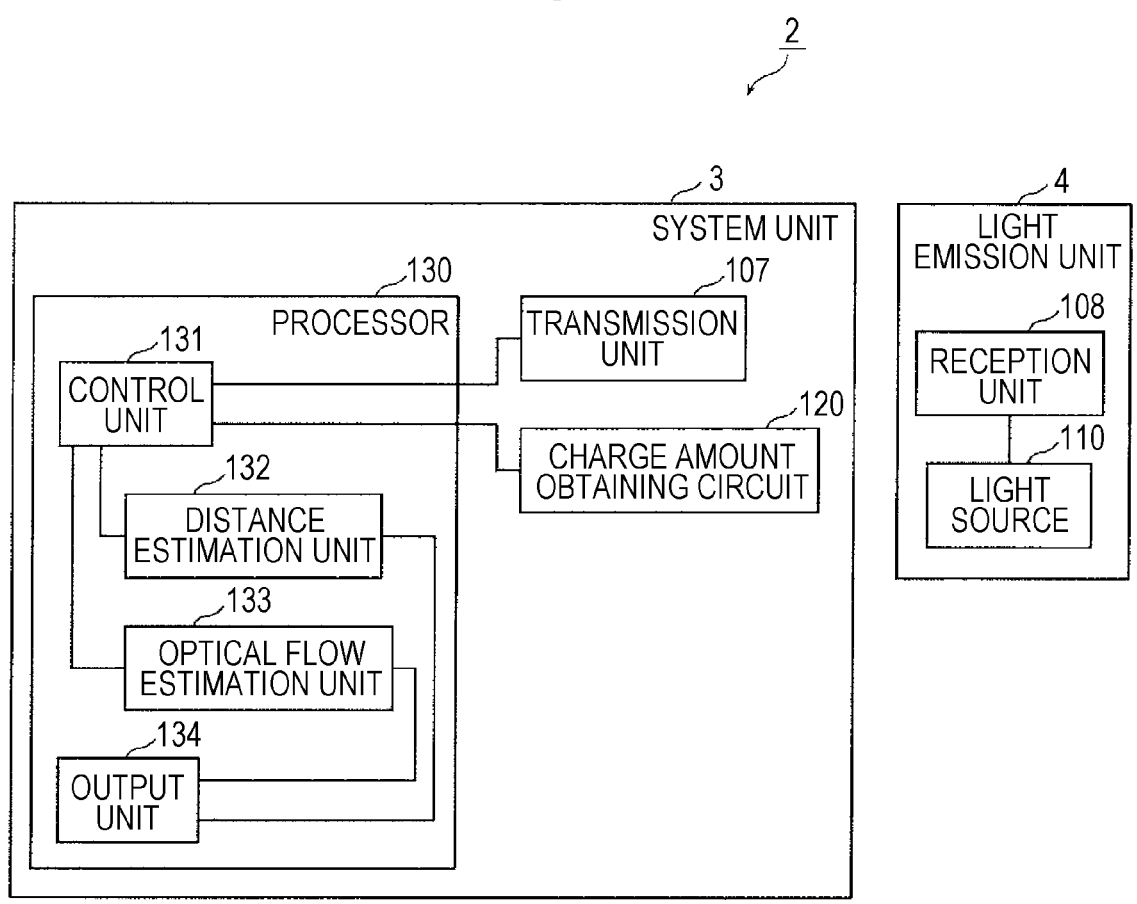
FIG. 14 is a block diagram illustrating a configuration of a three-dimensional motion obtaining apparatus according to a second embodiment.

FIG. 14 is a block diagram illustrating a configuration of a three-dimensional motion obtaining apparatus 2 according to an embodiment of the present disclosure. In FIG. 14, constituent elements that are the same as those in FIG. 1 are given the same reference numerals, and descriptions thereof will be omitted. As illustrated in FIG. 14, the three-dimensional motion obtaining apparatus 2 according to this embodiment is constituted by a system unit 3 and a light emission unit 4.

The system unit 3 includes the charge amount obtaining circuit 120, the processor 130, and a transmission unit 107.

The light emission unit 4 includes the light source 110 and a reception unit 108.

The transmission unit 107 has a function of transmitting a signal output from the processor 130 to the reception unit 108 wirelessly or via a wired line. More specifically, the transmission unit 107 has a function of transmitting, to the reception unit 108, a light emission control signal for causing the light source 110 to emit light in accordance with a light emission pattern generated by the control unit 131. The transmission unit 107 is implemented as, for example, a transmission circuit including a communication LSI circuit having a wireless communication function and a transmission antenna.

The reception unit 108 has a function of receiving a signal transmitted from the transmission unit 107 wirelessly or via a wired line and outputting the received signal to the light source 110. More specifically, the reception unit 108 has a function of receiving and outputting, to the light source 110, a light emission control signal transmitted from the transmission unit 107. The reception unit 108 is implemented as, for example, a reception circuit including a communication LSI circuit having a wireless communication function and a reception antenna. Here, the reception unit 108 is assumed to be a block external to the light source 110, and the description has been given; however, the light source 110 may include the reception unit 108, that is, the light source 110 may have the function of the reception unit 108.

Figure 15:
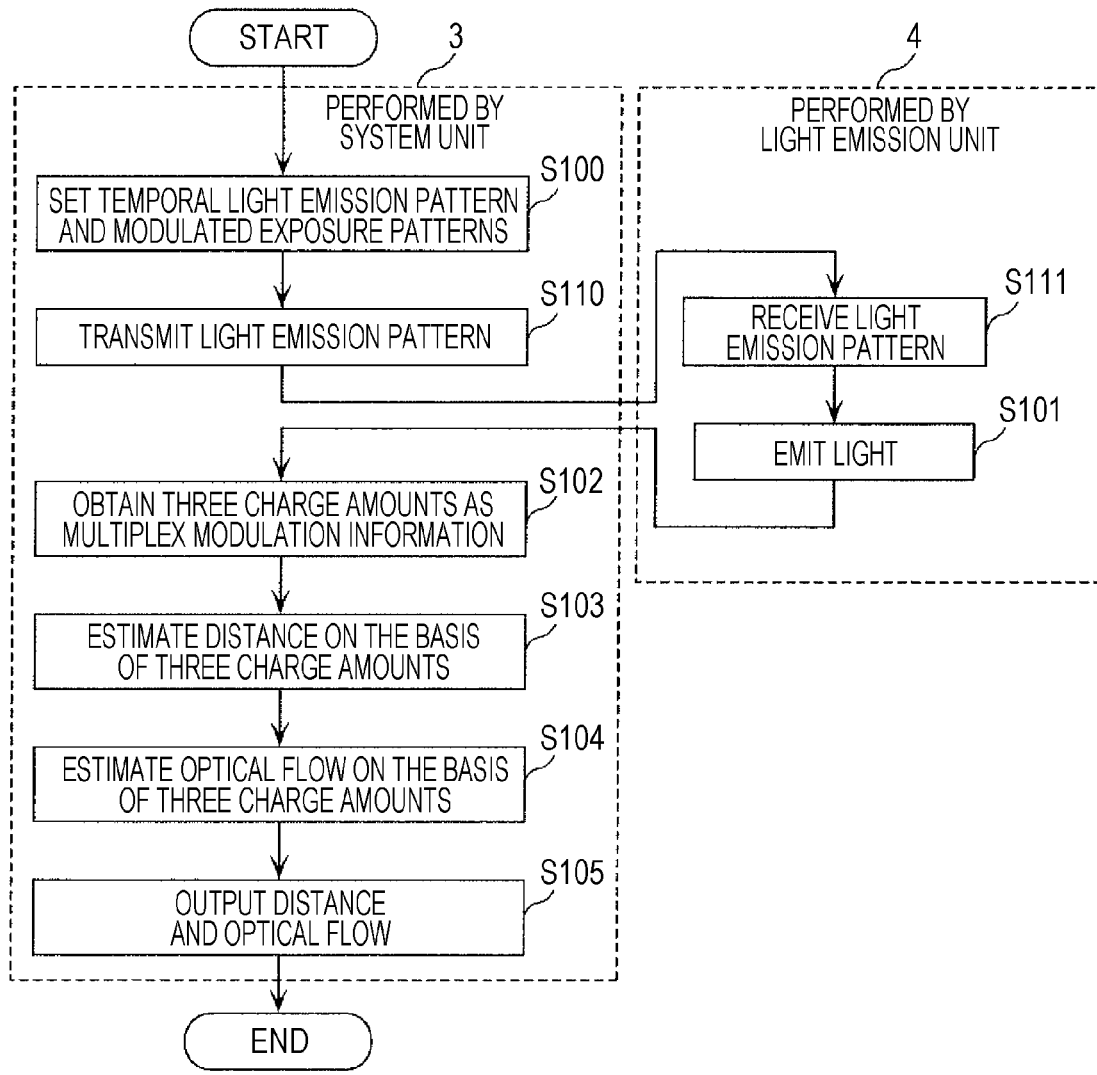
FIG. 15 is a flowchart illustrating example processing in the three-dimensional motion obtaining apparatus according to the second embodiment.

FIG. 15 is a flowchart illustrating example processing in the three-dimensional motion obtaining apparatus 2 according to this embodiment. In FIG. 15, constituent elements that are the same as those in FIG. 10 are given the same reference numerals, and descriptions thereof will be omitted. This processing is processing configured by adding a process in step S110 and a process in step S111 to the first processing illustrated in FIG. 10. Here, the process in step S110 and the process in step S111 are described.

Step S110

After completion of the process in step S100, the transmission unit 107 transmits the temporal light emission pattern set by the control unit 131 to the reception unit 108.

Step S111

The reception unit 108 receives and outputs, to the light source 110, the temporal light emission pattern transmitted from the transmission unit 107.

As described above, the three-dimensional motion obtaining apparatus 2 according to this embodiment can obtain highly accurate three-dimensional motion information similarly to the three-dimensional motion obtaining apparatus 1 according to the first embodiment.

Supplementary Note

Each of the constituent elements of the three-dimensional motion obtaining apparatuses 1 and 2 may be implemented as a single chip using a semiconductor device, such as an IC (integrated circuit) or an LSI (large scale integration) circuit, or some or all of the constituent elements may be implemented as a single chip. The technique for circuit integration is not limited to LSI, and circuit integration may be implemented by using a dedicated circuit or a general-purpose processor. An FPGA (field programmable gate array) that is programmable after manufacturing of the LSI, or a reconfigurable processor for which connections and/or settings of circuit cells within the LSI can be reconfigured may be used. Furthermore, if a technique for circuit integration that replaces LSI emerges with the advancement of semiconductor technology or on the basis of any technology that is separately derived, the functional blocks may be integrated by using the technique. Application of, for example, biotechnology is possible.

All or some of the various processes described above (for example, the procedures and so on illustrated in FIGS. 10, 12, and 15) may be implemented as hardware, such as an electronic circuit, or as software. The software processing is implemented by the processor included in the three-dimensional motion obtaining apparatus executing a control program stored in a memory. The control program may be recorded to a recording medium and distributed. For example, when the distributed control program is installed in the three-dimensional motion obtaining apparatus and executed by the processor of the three-dimensional motion obtaining apparatus, it is possible to cause the three-dimensional motion obtaining apparatus to perform various processes (for example, the procedures and so on illustrated in FIGS. 10, 12, and 15).

A form implemented by combining any constituent elements and functions illustrated in the above-described embodiments is within the scope of the present disclosure.

The present disclosure can be widely used in apparatuses that obtain both distance information and motion information about a subject.

What is claimed is:

1. A three-dimensional motion obtaining apparatus comprising:
a light source;
a charge amount obtaining circuit including an electrode control circuit and pixels, and the charge amount obtaining circuit being configured to obtain, for each of the pixels, a first charge amount under a first exposure pattern and a second charge amount under a second exposure pattern having an exposure period that at least partially overlaps an exposure period of the first exposure pattern, each of the pixels including a photoelectric converter comprising a first electrode; and
a processor configured to control a light emission pattern for the light source, the first exposure pattern, and the second exposure pattern, the processor being configured to control the electrode control circuit of the charge amount obtaining circuit so as to control a potential of the first electrode of each of the pixels of the charge amount obtaining circuit to thereby control the first exposure pattern,
wherein the processor is further configured to:
estimate a distance to a subject for each of the pixels of the charge amount obtaining circuit on the basis of the light emission pattern and on the basis of the first charge amount and the second charge amount of each of the pixels of the charge amount obtaining circuit obtained by the charge amount obtaining circuit,
estimate an optical flow for each of the pixels of the charge amount obtaining circuit on the basis of the first exposure pattern, the second exposure pattern, and the first charge amount and the second charge amount of each of the pixels of the charge amount obtaining circuit obtained by the charge amount obtaining circuit, and
output the estimated distance and the estimated optical flow.

2. The three-dimensional motion obtaining apparatus according to claim 1, wherein the processor is configured to control the first exposure pattern and the second exposure pattern by controlling an exposure period or an exposure sensitivity for each of the pixels of the charge amount obtaining circuit.

3. The three-dimensional motion obtaining apparatus according to claim 1, wherein the charge amount obtaining circuit is further configured to obtain, for each of the pixels, a third charge amount under a third exposure pattern having an exposure period that at least partially overlaps the exposure period of the first exposure pattern and the exposure period of the second exposure pattern,
wherein, in the first exposure pattern, an exposure sensitivity changes in a form of a sine wave having a predetermined cycle,
wherein, in the second exposure pattern, an exposure sensitivity changes in a form of a sine wave having the predetermined cycle and having a phase different from a phase of the sine wave in the first exposure pattern,
wherein, in the third exposure pattern, an exposure sensitivity changes in a form of a rectangular wave, and
wherein the processor is further configured to:
estimate the distance also on the basis of the third charge amount of each of the pixels of the charge amount obtaining circuit obtained by the charge amount obtaining circuit, and
estimate the optical flow also on the basis of the third charge amount of each of the pixels of the charge amount obtaining circuit obtained by the charge amount obtaining circuit.

4. The three-dimensional motion obtaining apparatus according to claim 3, wherein in the light emission pattern, a light emission amount changes in a form of a sine wave having the predetermined cycle.

5. The three-dimensional motion obtaining apparatus according to claim 1, wherein:
in the first exposure pattern, an exposure sensitivity changes in a form of a rectangular wave in a first period, and the exposure sensitivity changes in a form of a sine wave having a predetermined cycle in a second period that does not include the first period, and
in the second exposure pattern, an exposure sensitivity changes in a form of a rectangular wave in a third period, and the exposure sensitivity changes in a form of a sine wave having the predetermined cycle in a fourth period that does not include the third period.

6. The three-dimensional motion obtaining apparatus according to claim 5, wherein in the light emission pattern, a light emission amount changes in a form of a rectangular wave.

7. The three-dimensional motion obtaining apparatus according to claim 1, wherein:
each of the pixels includes sub-pixels within one aperture, the photoelectric converter being one of a pair of photoelectric converters and the first electrode being one of a pair of first electrodes, and
each of the sub-pixels includes a respective one of the pair of photoelectric converters that includes a corresponding one of the pair of first electrodes, a second electrode positioned further from the semiconductor substrate than the corresponding first electrode, and a photoelectric conversion member positioned between the first electrode and the second electrode, which are stacked upward on a main flat surface of a semiconductor substrate, and
the electrode control circuit is configured to control a potential of the first electrode in each of the sub-pixels.

8. The three-dimensional motion obtaining apparatus according to claim 7, wherein the electrode control circuit is electrically connected to the first electrode in each of the sub-pixels via a capacitor.

9. The three-dimensional motion obtaining apparatus according to claim 8, wherein each of the pixels includes one color filter shared by the sub-pixels included in the pixel.

10. The three-dimensional motion obtaining apparatus according to claim 9, wherein each of the pixels includes one on-chip micro-lens shared by the sub-pixels included in the pixel.

11. The three-dimensional motion obtaining apparatus according to claim 7, wherein the electrode control circuit is configured to change the potential of the respective one of the pair of first electrode in each of the sub-pixels in a non-exposure period other than the exposure period to change an exposure sensitivity for each of the sub-pixels.

12. The three-dimensional motion obtaining apparatus according to claim 1, wherein the processor is configured to calculate two or more optical flow constraint equations independent of each other on the basis of the first exposure pattern, the second exposure pattern, and the first charge amount and the second charge amount of each of the pixels of the charge amount obtaining circuit obtained by the charge amount obtaining circuit, and to use the calculated optical flow constraint equations to estimate the optical flow.

13. The three-dimensional motion obtaining apparatus according to claim 12, wherein in the light emission pattern, a light emission amount of the light source changes in at least a partial period in the exposure period of the first exposure pattern and in at least a partial period in the exposure period of the second exposure pattern.

14. The three-dimensional motion obtaining apparatus according to claim 1, further comprising a transmission unit configured to transmit, to the light source, a light emission control signal for causing the light source to emit light in accordance with the light emission pattern, wherein the light source receives the light emission control signal transmitted from the transmission unit and emits light in accordance with the light emission pattern on the basis of the received light emission control signal.

15. A three-dimensional motion obtaining method to be performed by a three-dimensional motion obtaining apparatus including a light source, a charge amount obtaining circuit including pixels and an electrode control circuit, and a processor, each of the pixels of the charge amount obtaining circuit including a photoelectric converter comprising a first electrode, the method comprising:
  controlling, by the processor, a light emission pattern for the light source, and a first exposure pattern and a second exposure pattern for each of the pixels of the charge amount obtaining circuit, the second exposure pattern having an exposure period that at least partially overlaps an exposure period of the first exposure pattern;
  controlling a potential of the first electrode by the electrode control circuit, the electrode control circuit being controlled by the processor, to thereby control the first exposure pattern;
  obtaining, by the charge amount obtaining circuit for each of the pixels, a first charge amount under the first exposure pattern and a second charge amount under the second exposure pattern;
  estimating, by the processor, a distance to a subject for each of the pixels of the charge amount obtaining circuit on the basis of the light emission pattern and on the basis of the first charge amount and the second charge amount of each of the pixels of the charge amount obtaining circuit obtained by the charge amount obtaining circuit;
  estimating, by the processor, an optical flow for each of the pixels of the charge amount obtaining circuit on the basis of the first exposure pattern, the second exposure pattern, and the first charge amount and the second charge amount of each of the pixels of the charge amount obtaining circuit obtained by the charge amount obtaining circuit; and
  outputting, by the processor, the estimated distance and the estimated optical flow.

16. The three-dimensional motion obtaining method according to claim 15, further comprising controlling, by the processor, the first exposure pattern and controlling, by the processor, the second exposure pattern by controlling an exposure period or an exposure sensitivity for each of the pixels of the charge amount obtaining circuit.

17. The three-dimensional motion obtaining method according to claim 15, further comprising:
  obtaining, by the charge amount obtaining circuit, for each of the pixels, a third charge amount under a third exposure pattern having an exposure period that at least partially overlaps the exposure period of the first exposure pattern and the exposure period of the second exposure pattern,
  changing, in the first exposure pattern, an exposure sensitivity in a form of a sine wave having a predetermined cycle,
  changing, in the second exposure pattern, an exposure sensitivity in a form of a sine wave having the predetermined cycle and having a phase different from a phase of the sine wave in the first exposure pattern,
  changing, in the third exposure pattern, an exposure sensitivity in a form of a rectangular wave,
  estimating, by the processor, the distance also on the basis of the third charge amount of each of the pixels of the charge amount obtaining circuit obtained by the charge amount obtaining circuit, and
  estimating, by the processor, the optical flow also on the basis of the third charge amount of each of the pixels of the charge amount obtaining circuit obtained by the charge amount obtaining circuit.

18. The three-dimensional motion obtaining method according to claim 17, further comprising changing, in the light emission pattern, a light emission amount in a form of a sine wave having the predetermined cycle.

19. The three-dimensional motion obtaining method according to claim 15, further comprising:
  changing, in the first exposure pattern, an exposure sensitivity in a form of a rectangular wave in a first period, and changing the exposure sensitivity in a form of a sine wave having a predetermined cycle in a second period that does not include the first period, and
  changing in the second exposure pattern, an exposure sensitivity in a form of a rectangular wave in a third period, and changing the exposure sensitivity in a form of a sine wave having the predetermined cycle in a fourth period that does not include the third period.

20. The three-dimensional motion obtaining method according to claim 19, further comprising changing, in the light emission pattern, a light emission amount in a form of a rectangular wave.

* * * * *